United States Patent
Hazelton et al.

(10) Patent No.: US 8,836,914 B2
(45) Date of Patent: Sep. 16, 2014

(54) ENVIRONMENTAL SYSTEM INCLUDING VACUUM SCAVENGE FOR AN IMMERSION LITHOGRAPHY APPARATUS

(75) Inventors: Andrew J. Hazelton, Tokyo (JP); Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/529,663

(22) Filed: Jun. 21, 2012

(65) Prior Publication Data
US 2012/0262684 A1 Oct. 18, 2012

Related U.S. Application Data

(60) Division of application No. 12/382,661, filed on Mar. 20, 2009, and a continuation of application No. 11/646,238, filed on Dec. 28, 2006, now abandoned, and a division of application No. 11/237,799, filed on Sep. 29, 2005, now Pat. No. 7,321,415, and a continuation of application No. PCT/IB2004/002704, filed on Mar. 29, 2004.

(60) Provisional application No. 60/462,112, filed on Apr. 10, 2003, provisional application No. 60/484,476, filed on Jul. 1, 2003.

(51) Int. Cl.
*G03B 27/52* (2006.01)
*G03F 7/20* (2006.01)

(52) U.S. Cl.
CPC .......... *G03F 7/70341* (2013.01); *G03F 7/2041* (2013.01); *G03F 7/70866* (2013.01); *G03F 7/70816* (2013.01)

USPC .................................. 355/30; 355/53; 355/55

(58) Field of Classification Search
CPC ............ G03F 7/70341; G03F 7/70908; G03F 7/70916; G03F 7/70925; G03F 7/2041; G03F 7/70816; G03F 7/70866
USPC .......................................... 355/30, 53, 55, 72
See application file for complete search history.

(56) References Cited

U.S. PATENT DOCUMENTS

| | | | |
|---|---|---|---|
| 3,648,587 | A | 3/1972 | Stevens |
| 4,346,164 | A | 8/1982 | Tabarelli et al. |
| 4,441,808 | A | 4/1984 | Giacomelli |

(Continued)

FOREIGN PATENT DOCUMENTS

| | | |
|---|---|---|
| CN | 1573571 A | 2/2005 |
| DE | 221 563 A1 | 4/1985 |

(Continued)

OTHER PUBLICATIONS

Jul. 27, 2012 Office Action issued in EP Application No. 04758599.7.

(Continued)

*Primary Examiner* — Steven H Whitesell Gordon
(74) *Attorney, Agent, or Firm* — Oliff PLC

(57) ABSTRACT

A liquid immersion lithography apparatus exposes a wafer through a liquid in a space under a lens. The apparatus includes a containment member provided such that the containment member surrounds the space under the lens, and a seal member provided between the lens and the containment member. The containment member has a first fluid inlet. The first fluid inlet removes fluid from a gap between the containment member and the wafer during the exposure.

43 Claims, 15 Drawing Sheets

(56) References Cited

U.S. PATENT DOCUMENTS

| | | | |
|---|---|---|---|
| 4,480,910 A | 11/1984 | Takanashi et al. | |
| 4,509,852 A | 4/1985 | Tabarelli et al. | |
| 5,528,100 A | 6/1996 | Igeta et al. | |
| 5,528,118 A | 6/1996 | Lee | |
| 5,610,683 A | 3/1997 | Takahashi | |
| 5,623,853 A | 4/1997 | Novak et al. | |
| 5,668,672 A | 9/1997 | Oomura | |
| 5,689,377 A | 11/1997 | Takahashi | |
| 5,707,535 A | 1/1998 | Harris | |
| 5,715,039 A | 2/1998 | Fukuda et al. | |
| 5,825,043 A | 10/1998 | Suwa | |
| 5,835,275 A | 11/1998 | Takahashi et al. | |
| 5,845,170 A | 12/1998 | Ogata | |
| 5,874,820 A | 2/1999 | Lee | |
| 5,969,441 A | 10/1999 | Loopstra et al. | |
| 5,997,963 A | 12/1999 | Davison et al. | |
| 6,191,429 B1 | 2/2001 | Suwa | |
| 6,236,634 B1 | 5/2001 | Lee et al. | |
| 6,262,796 B1 | 7/2001 | Loopstra et al. | |
| 6,310,680 B1 | 10/2001 | Taniguchi | |
| 6,391,503 B2 | 5/2002 | Ebihara | |
| 6,400,441 B1 | 6/2002 | Nishi et al. | |
| 6,417,914 B1 | 7/2002 | Li | |
| 6,438,074 B1 | 8/2002 | Aki et al. | |
| 6,446,358 B1 | 9/2002 | Mitsumori et al. | |
| 6,488,040 B1 | 12/2002 | de Larios et al. | |
| 6,778,257 B2 | 8/2004 | Bleeker et al. | |
| 6,781,670 B2 | 8/2004 | Krautschik | |
| 6,788,477 B2 | 9/2004 | Lin | |
| 6,867,844 B2 | 3/2005 | Vogel et al. | |
| 6,952,253 B2 | 10/2005 | Lof et al. | |
| 6,988,327 B2 | 1/2006 | Garcia et al. | |
| 7,053,983 B2 | 5/2006 | Tokita | |
| 7,057,702 B2 | 6/2006 | Lof et al. | |
| 7,251,017 B2 | 7/2007 | Novak et al. | |
| 7,268,854 B2 | 9/2007 | Nagasaka | |
| 7,321,415 B2 | 1/2008 | Hazelton et al. | |
| 7,321,419 B2 | 1/2008 | Ebihara | |
| 7,345,742 B2 | 3/2008 | Novak et al. | |
| 7,352,434 B2 | 4/2008 | Streefkerk et al. | |
| 7,355,676 B2 | 4/2008 | Sogard | |
| 7,369,217 B2 | 5/2008 | Carroll | |
| 7,388,648 B2 | 6/2008 | Lof et al. | |
| 7,399,979 B2 | 7/2008 | Nagasaka | |
| 7,436,486 B2 | 10/2008 | Hirukawa | |
| 7,446,851 B2 | 11/2008 | Hirukawa | |
| 7,453,550 B2 | 11/2008 | Nagasaka et al. | |
| 7,456,930 B2 | 11/2008 | Hazelton et al. | |
| 7,471,371 B2 | 12/2008 | Kameyama | |
| 7,486,385 B2 | 2/2009 | Ebihara | |
| 7,495,744 B2 | 2/2009 | Nagasaka | |
| 7,505,111 B2 | 3/2009 | Hirukawa et al. | |
| 7,535,550 B2 | 5/2009 | Nagasaka | |
| 7,542,128 B2 | 6/2009 | Nagasaka et al. | |
| 7,589,821 B2 | 9/2009 | Hirukawa | |
| 7,639,343 B2 | 12/2009 | Hirukawa | |
| 7,671,963 B2 | 3/2010 | Streefkerk et al. | |
| 7,936,444 B2 | 5/2011 | Streefkerk et al. | |
| 8,089,610 B2 | 1/2012 | Hazelton et al. | |
| 2001/0006762 A1 | 7/2001 | Kwan et al. | |
| 2002/0020821 A1 | 2/2002 | Van Santen et al. | |
| 2002/0080339 A1 | 6/2002 | Takahashi | |
| 2002/0163629 A1 | 11/2002 | Switkes et al. | |
| 2003/0030916 A1 | 2/2003 | Suenaga | |
| 2003/0134574 A1* | 7/2003 | Uziel | 451/39 |
| 2003/0145874 A1 | 8/2003 | Myland | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1* | 10/2004 | Lof et al. | 355/30 |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0007569 A1 | 1/2005 | Streefkerk et al. | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068499 A1 | 3/2005 | Dodoc et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0088635 A1 | 4/2005 | Hoogendam et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Zaal et al. | |
| 2005/0225737 A1 | 10/2005 | Weissenrieder et al. | |
| 2005/0233081 A1 | 10/2005 | Tokita | |
| 2005/0253090 A1 | 11/2005 | Gau et al. | |
| 2005/0259233 A1 | 11/2005 | Streefkerk et al. | |
| 2005/0259234 A1 | 11/2005 | Hirukawa et al. | |
| 2005/0264778 A1 | 12/2005 | Lof et al. | |
| 2005/0270505 A1 | 12/2005 | Smith | |
| 2005/0270506 A1 | 12/2005 | Streefkerk et al. | |
| 2005/0280791 A1 | 12/2005 | Nagasaka et al. | |
| 2005/0286032 A1 | 12/2005 | Lof et al. | |
| 2006/0005860 A1 | 1/2006 | Garcia | |
| 2006/0012765 A1 | 1/2006 | Kameyama | |
| 2006/0023182 A1 | 2/2006 | Novak et al. | |
| 2006/0023184 A1 | 2/2006 | Coon et al. | |
| 2006/0023189 A1 | 2/2006 | Lof et al. | |
| 2006/0038968 A1 | 2/2006 | Kemper et al. | |

(56) References Cited

U.S. PATENT DOCUMENTS

| | | |
|---|---|---|
| 2006/0066828 A1 | 3/2006 | Klerk |
| 2006/0087630 A1 | 4/2006 | Kemper et al. |
| 2006/0098177 A1 | 5/2006 | Nagasaka |
| 2006/0114445 A1 | 6/2006 | Ebihara |
| 2006/0119807 A1 | 6/2006 | Baselmans et al. |
| 2006/0132739 A1 | 6/2006 | Ebihara |
| 2006/0132740 A1 | 6/2006 | Ebihara |
| 2006/0139613 A1 | 6/2006 | Houkes et al. |
| 2006/0146306 A1 | 7/2006 | Nagasaka et al. |
| 2006/0164615 A1 | 7/2006 | Hirukawa |
| 2006/0268249 A1 | 11/2006 | Kameyama |
| 2006/0274293 A1 | 12/2006 | Nagasaka et al. |
| 2007/0109516 A1 | 5/2007 | Kameyama |
| 2007/0211234 A1 | 9/2007 | Ebihara |
| 2007/0258064 A1 | 11/2007 | Hirukawa |
| 2007/0258065 A1 | 11/2007 | Nagasaka et al. |
| 2007/0263183 A1 | 11/2007 | Nagasaka et al. |
| 2007/0263185 A1 | 11/2007 | Nagasaka et al. |
| 2008/0002166 A1 | 1/2008 | Ebihara |
| 2008/0030697 A1 | 2/2008 | Kameyama |
| 2008/0151203 A1 | 6/2008 | Hirukawa et al. |
| 2008/0297746 A1 | 12/2008 | Nagasaka |
| 2009/0009745 A1 | 1/2009 | Nagasaka |
| 2009/0015807 A1 | 1/2009 | Hirukawa et al. |
| 2009/0190112 A1 | 7/2009 | Ebihara |
| 2011/0181859 A1 | 7/2011 | Streefkerk et al. |
| 2011/0273683 A1 | 11/2011 | Streefkerk et al. |
| 2011/0279795 A1 | 11/2011 | Streefkerk et al. |

FOREIGN PATENT DOCUMENTS

| | | |
|---|---|---|
| DE | 224 448 A1 | 7/1985 |
| EP | 0 312 066 A2 | 4/1989 |
| EP | 1 052 552 A2 | 11/2000 |
| EP | 1 420 298 A2 | 5/2004 |
| EP | 1 420 299 A2 | 5/2004 |
| EP | 1 420 300 A2 | 5/2004 |
| EP | 1 477 856 A1 | 11/2004 |
| EP | 1 571 695 A1 | 9/2005 |
| EP | 1 571 697 A1 | 9/2005 |
| EP | 1 571 698 A1 | 9/2005 |
| EP | 1 612 850 A1 | 1/2006 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-53120 | 2/1994 |
| JP | A-6-124873 | 5/1994 |
| JP | A-6-188169 | 7/1994 |
| JP | A-7-220990 | 8/1995 |
| JP | A-08-136475 | 5/1996 |
| JP | A-8-166475 | 6/1996 |
| JP | A-08-171054 | 7/1996 |
| JP | A-8-316125 | 11/1996 |
| JP | A-08-330224 | 12/1996 |
| JP | A-08-334695 | 12/1996 |
| JP | A-10-003039 | 1/1998 |
| JP | A-10-020195 | 1/1998 |
| JP | A-10-163099 | 6/1998 |
| JP | A-10-214783 | 8/1998 |
| JP | A-10/255319 | 9/1998 |
| JP | A-10-303114 | 11/1998 |
| JP | A-10-340846 | 12/1998 |
| JP | A-11-135400 | 5/1999 |
| JP | A-11-176727 | 7/1999 |
| JP | A-11-260791 | 9/1999 |
| JP | A-2000-58436 | 2/2000 |
| JP | A-2000-505958 | 5/2000 |
| JP | A-2004-165666 | 6/2004 |
| JP | A-2004-289126 | 10/2004 |
| JP | A-2004-289127 | 10/2004 |
| JP | A-2004-343114 | 12/2004 |
| JP | A-2004-349645 | 12/2004 |
| JP | A-2005-109426 | 4/2005 |
| JP | A-2005-109488 | 4/2005 |
| JP | A-2005-116571 | 4/2005 |
| JP | A-2005-129914 | 5/2005 |
| JP | A-2005-159322 | 6/2005 |
| JP | A-2005-183744 | 7/2005 |
| TW | 350980 | 1/1999 |
| WO | WO 98/28665 | 7/1998 |
| WO | WO 99/49504 A1 | 9/1999 |
| WO | WO 01/35168 A1 | 5/2001 |
| WO | WO 02/091078 A1 | 11/2002 |
| WO | WO 03/077037 A1 | 9/2003 |
| WO | WO 2004/019128 A2 | 3/2004 |
| WO | WO 2004/032160 A2 | 4/2004 |
| WO | WO 2004/053935 A2 | 6/2004 |
| WO | WO 2004/053955 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/086468 A1 | 10/2004 |
| WO | WO 2004/086470 A1 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/105106 A1 | 12/2004 |
| WO | WO 2004/107048 A2 | 12/2004 |
| WO | WO 2004/114380 A1 | 12/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2006/007111 A2 | 1/2006 |
| WO | WO 2006/009573 A1 | 1/2006 |

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

(56) References Cited

OTHER PUBLICATIONS

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, 3$^{rd}$ 157 nm symposium, Sep. 4, 2002, "Nikon F2 Exposure Tool", Soichi Owa et al., 25 pages (slides 1-25).
Nikon Corporation, Immersion Lithography Workshop, Dec. 11, 2002, 24 pages (slides 1-24).
Nikon Corporation, NGL Workshop, Jul. 10, 2003, :Potential performance and feasibility of immersion lithography, Soichi Owa et al., 33 pages, slides 1-33.
Nikon Corporation, Immersion Workshop, Jan. 27, 2004, "Update on 193 nm immersion exposure tool", S. Owa et al., 38 pages (slides 1-38).
Nikon Corporation, Litho Forum, Jan. 28, 2004, "Update on 193 nm immersion exposure tool", S. Owa et al., 51 pages (slides 1-51).
Hiroaki Kawata et al; "Optical Projection Lithography Using lenses with Numerical Apertures Greater Than Unity"; *Microelectronic Engineering*; vol. 9; 1989; pp. 31-36.
Hiroaki Kawata et al; "Fabrication of 0.2 μm Fine Patterns Using Optical Projection Lithography with an Oil Immersion Lens"; *Jpn. J. Appl. Phys.*; vol. 31, Part 1, No. 128; Dec. 1992; pp. 4174-4177.
G. Owen et al.; "1/8 μM Optical Lithography"; *J. Vac. Sci. Technol. B.*; vol. 10, No. 6; Nov./Dec. 1992; pp. 3032-3036.
Willi Ulrich et al.; "The Development of Dioptric Projection Lenses for DUV Lithography"; Proceedings of *SPIE*; vol. 4832; 2002; pp. 158-169.
M. Switkes et al.; "Resolution Enhancement of 157 nm Lithography by Liquid Immersion"; *J. Microlith., Microfab., Microsyst.*; vol. 1, No. 3; Oct. 2002; pp. 225-228.
Bruce W. Smith et al.; "Water Immersion Optical Lithography for the 45nm Node"; Optical Microlithography XVI; *Proceedings of SPIE*; vol. 5040; 2003; pp. 679-689.
Soichi Owa et al.; "Immersion Lithography; Its Potential Performance and Issues"; Optical Microlithography XVI; *Proceedings of SPIE*; vol. 5040; 2003; pp. 724-733.
Scott Hafeman et al.; "Simulation of Imaging and Stray Light Effects in Immersion Lithography"; Optical Microlithography XVI; *Proceedings of SPIE*; vol. 5040; 2003; pp. 700-712.
So-Yeon Baek et al.; "Simulation Study of Process Latitude for Liquid Immersion Lithography"; Optical Microlithography XVI; *Proceedings of SPIE*; vol. 5040; 2003; pp. 1620-1630.
Mark D. Feur et al.; "Projection Photolithography-Liftoff Techniques for Production of 0.2-μm Metal Patterns"; *IEEE Transactions on Electron Devices*; vol. 28, No. 11; Nov. 1981; pp. 1375-1378.
Oct. 1, 2008 Supplementary European Search Report for EP 04 75 8599.
Nov. 30, 2006 International Search Report and Written Opinion for PCT/IB04/02704.
Nov. 7, 2006 Australian Search Report and Written Opinion for Singapore Patent Application No. 200506412-6.
Jan. 25, 2006 Office Action in U.S. Appl. No. 11/237,799.
Oct. 18, 2006 Notice of Allowance in U.S. Appl. No. 11/237,799.
Apr. 10, 2007 Notice of Allowance in U.S. Appl. No. 11/237,799.
Aug. 29, 2007 Notice of Allowance in U.S. Appl. No. 11/237,799.
Aug. 1, 2006 Office Action in U.S. Appl. No. 11/253,597.
Mar. 23, 2007 Notice of Allowance in U.S. Appl. No. 11/253,597.
Apr. 4, 2006 Office Action in U.S. Appl. No. 11/329,269.
Dec. 7, 2006 Notice of Allowance in U.S. Appl. No. 11/329,269.
May 29, 2007 Notice of Allowance in U.S. Appl. No. 11/329,269.
Nov. 14, 2007 Notice of Allowance in U.S. Appl. No. 11/329,269.
Jun. 16, 2009 Office Action in U.S. Appl. No. 11/701,378.
Jan. 8, 2009 Office Action in U.S. Appl. No. 11/701,378.
Apr. 17, 2008 Office Action in U.S. Appl. No. 11/701,378.
Oct. 16, 2007 Office Action in U.S. Appl. No. 11/819,089.
Jul. 25, 2008 Notice of Allowance in U.S. Appl. No. 11/819,089.
Jul. 24, 2007 Office Action in U.S. Appl. No. 11/705,001.
Oct. 30, 2007 Notice of Allowance in U.S. Appl. No. 11/705,001.
Feb. 1, 2006 Office Action in U.S. Appl. No. 11/236,713.
Mar. 23, 2007 Notice of Allowance in U.S. Appl. No. 11/236,713.
Oct. 17, 2008 Office Action in U.S. Appl. No. 11/819,446.
Jul. 9, 2009 Office Action in U.S. Appl. No. 11/819,446.
Oct. 16, 2008 Office Action in U.S. Appl. No. 11/819,691.
Jul. 9, 2009 Office Action in U.S. Appl. No. 11/819,691.
Oct. 16, 2008 Office Action in U.S. Appl. No. 11/819,689.
Jul. 9, 2009 Office Action in U.S. Appl. No. 11/819,689.
Oct. 16, 2008 Office Action in U.S. Appl. No. 11/819,447.
Jul. 9, 2009 Office Action in U.S. Appl. No. 11/819,447.
Jul. 14, 2010 Notice of Allowance in U.S. Appl. No. 11/701,378.
Sep. 3, 2010 Notice of Allowance in U.S. Appl. No. 10/593,802.
Nov. 10, 2010 Notice of Allowance in U.S. Appl. No. 11/635,607.
Jul. 26, 2010 Chinese Office Action in Chinese Application No. 200480009675.7, with translation.
Aug. 22, 2008 Office Action in Chinese Application No. 200480009673.8, with translation.
May 8, 2009 Office Action in Chinese Application No. 200480009673.8, with translation.
Dec. 19, 2008 Office Action in U.S. Appl. No. 11/635,607.
Aug. 28, 2009 Office Action in U.S. Appl. No. 11/635,607.
Apr. 1, 2009 Office Action in U.S. Appl. No. 10/593,802,.
Nov. 27, 2009 Notice of Allowance in U.S. Appl. No. 10/593,802.
Feb. 2, 2010 Office Action for Japanese Patent Application No. 2006-511475 (with translation).
May 4, 2010 Notice of Allowance in U.S. Appl. No. 11/819,691.
Mar. 25, 2010 Notice of Allowance in U.S. Appl. No. 10/593,802.
Dec. 8, 2009 Office Action in Japanese Application No. 2006-506634, with translation.
Dec. 8, 2009 Office Action in Japanese Application No. 2006-509568, with translation.
May 11, 2010 Notice of Allowance in Japanese Application No. 2006-511475, with translation.
Nov. 21, 2008 Office Action in Chinese Application No. 200480009675.7, with translation.
Oct. 9, 2009 Office Action in Chinese Application No. 200480009675.7, with translation.
Nov. 20, 2009 Notice of Allowance in Chinese Application No. 200480009673.8, with translation.
Dec. 20, 2006 Australian Invitation to Respond to Written Opinion in Singapore Application No. 200506412-6.
Aug. 17, 2007 Australian Examination Report in Singapore Application No. 200506412-6.
Aug. 9, 2005 International Search Report in Application No. PCT/JP2005/005254, with translation.
Sep. 23, 2008 Supplemental European Search Report in European Application No. 04759085.6.
Oct. 13, 2005 International Search Report in Application No. PCT/US04/09994.
Nov. 30, 2006 International search report and Written opinion in Application No. PCT/IB04/002704.
Mar. 24, 2009 Advisory Action in U.S. Appl. No. 11/701,378.
Mar. 23, 2010 Notice of Allowance in U.S. Appl. No. 11/701,378.
Mar. 31, 2010 Supplemental Notice of Allowance in U.S. Appl. No. 11/701,378.
Feb. 27, 2007 Office Action in U.S. Appl. No. 11/239,493.
Jun. 27, 2007 Notice of Allowance in U.S. Appl. No. 11/239,493.
Feb. 15, 2008 Notice of Allowance in U.S. Appl. No. 11/239,493.
Nov. 2, 2006 Office Action in U.S. Appl. No. 11/237,799.
Apr. 15, 2010 Office Action in U.S. Appl. No. 11/819,446.
Apr. 15, 2010 Office Action in U.S. Appl. No. 11/819,447.
May 3, 2010 Notice of Allowance in U.S. Appl. No. 11/819,689.
Dec. 13, 2010 Notice of Allowance in U.S. Appl. No. 11/819,446.
Dec. 13, 2010 Notice of Allowance in U.S. Appl. No. 11/819,447.
Dec. 23, 2010 Notice of Allowance in U.S. Appl. No. 10/593,802.
Dec. 21, 2010 Notice of Allowance in U.S. Appl. No. 11/635,607.
Nov. 16, 2010 Notice of Allowance in Japanese Application No. 2006-509568, with translation.
Nov. 16, 2010 Office Action in Japanese Application No. 2006-506634, with translation.
Jan. 12, 2011 Office Action in Chinese Application No. 201010113626.5, with translation.
Jan. 14, 2011 Office Action in Korean Application No. 2005-7019303, with translation.

(56) References Cited

OTHER PUBLICATIONS

Jan. 14, 2011 Office Action in Korean Application No. 2005-7019305, with translation.
Jan. 3, 2011 Search and Examination Report in Singapore Application No. 200800250-3.
Jan. 13, 2011 Search and Examination Report in Singapore Application No. 200800251-1.
Feb. 22, 2011 Office Action in Japanese Application No. 2006-506634, with translation.
Mar. 31, 2011 Office Action issued in Chinese Patent Application No. 200480009675.7, with translation.
Jul. 18, 2011 Office Action issued in U.S. Appl. No. 12/382,661.
Dec. 2, 2011 Notice of Allowance issued in U.S. Appl. No. 10/593,802.
Jan. 9, 2012 Notice of Allowance issued in U.S. Appl. No. 11/635,607.
Jan. 25, 2012 Office Action issued in U.S. Appl. No. 12/382,229.
Apr. 2, 2012 Notice of Allowance issued in U.S. Appl. No. 12/382,661.
Jun. 25, 2012 Office Action issued in Taiwanese Application No. 097127865 (with English translation).
Aug. 14, 2012 Office Action issued in JP Application No. 2010-026002 (with English translation).
Dec. 20, 2012 Office Action issued in Korean Patent Application No. 2012-7025345 (with English translation).
Mar. 12, 2013 Office Action issued in European Patent Application No. 04758599.7.
Mar. 25, 2013 Office Action issued in European Patent Application No. 04759085.6.
Sep. 11, 2013 Office Action issued in U.S. Appl. No. 13/067,464.
May 29, 2013 Office Action issued in Korean Patent Application No. 2012-7009421 (with translation).
Apr. 19, 2013 Office Action issued in U.S. Appl. No. 13/067,464.
Jul. 11, 2013 Office Action issued in U.S. Appl. No. 12/926,029.
Jun. 21, 2013 Office Action issued in U.S. Appl. No. 13/789,308.
Sep. 25, 2013 Office Action issued in Korean Patent Application No. 2012-7021786 (with translation).
Oct. 14, 2013 Office Action issued in European Patent Application No. 13 180 845.3.
Nov. 5, 2013 Office Action issued in European Patent Application No. 13 180 843.8.
Jan. 8, 2014 Office Action issued in U.S. Appl. No. 13/067,464.
Dec. 31, 2013 Office Action issued in U.S. Appl. No. 12/926,029.
Apr. 2, 2014 Office Action issued in European Patent Application No. 13196627.7.

* cited by examiner

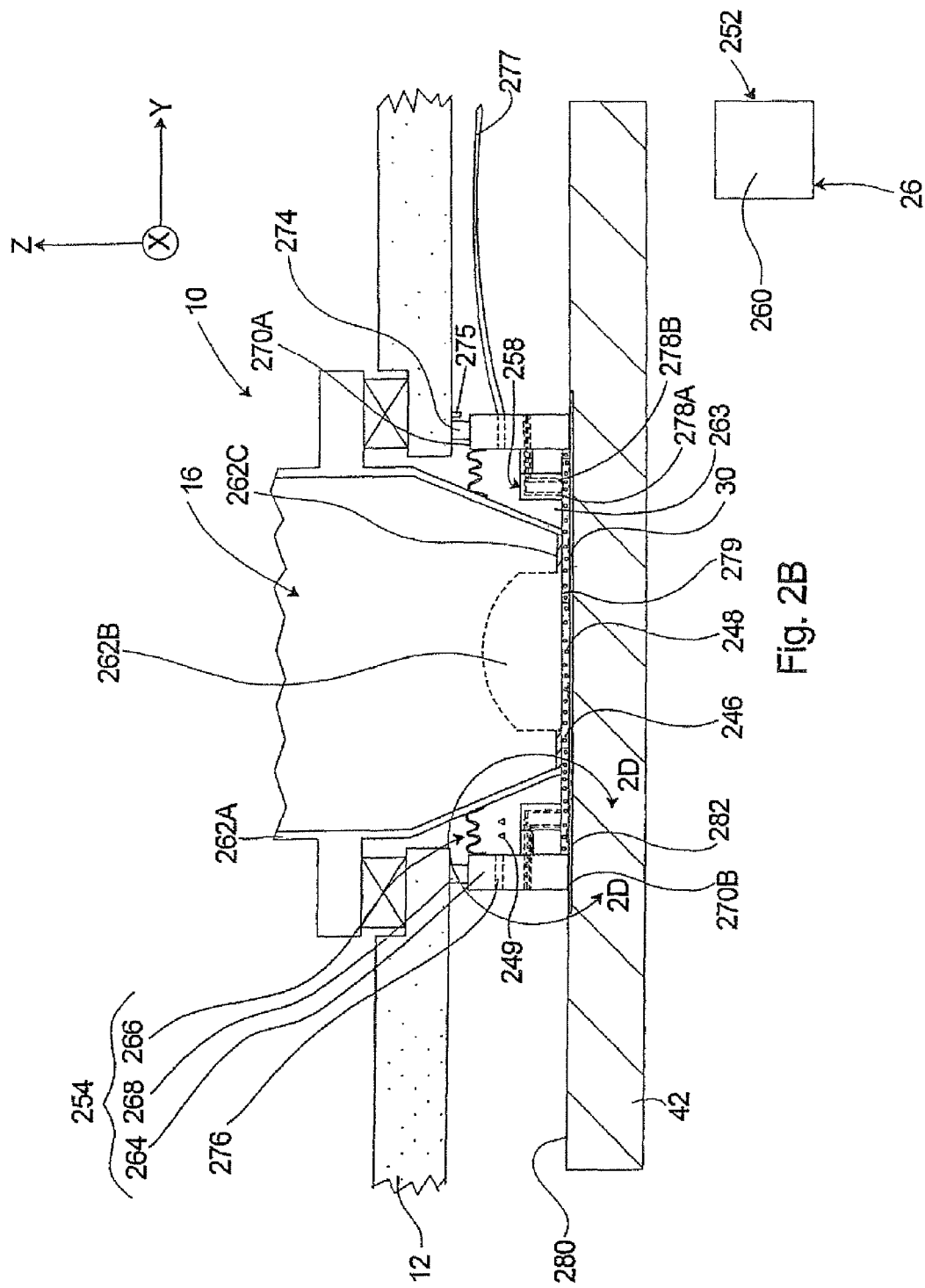

ENVIRONMENTAL SYSTEM INCLUDING VACUUM SCAVENGE FOR AN IMMERSION LITHOGRAPHY APPARATUS

RELATED APPLICATION

This is a Divisional of U.S. patent application Ser. No. 12/382,661 filed Mar. 20, 2009, which in turn is a Continuation of application Ser. No. 11/646,238 filed Dec. 28, 2006 (now abandoned), which is a Divisional of application No. Ser. 11/237,799 filed Sep. 29, 2005 (now U.S. Pat. No. 7,321, 415), which is a Continuation of International Application No. PCT/IB2004/002704 filed Mar. 29, 2004, which claims the benefit of U.S. Provisional Patent Application No. 60/462, 112 filed on Apr. 10, 2003 and U.S. Provisional Patent Application No. 60/484,476 filed on Jul. 1, 2003. The disclosures of these applications are incorporated herein by reference in their entireties.

BACKGROUND

Lithography exposure apparatus are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, and a measurement system that precisely monitors the position of the reticle and the wafer.

Immersion lithography systems utilize a layer of immersion fluid that completely fills a gap between the optical assembly and the wafer. The wafer is moved rapidly in a typical lithography system and it would be expected to carry the immersion fluid away from the gap. This immersion fluid that escapes from the gap can interfere with the operation of other components of the lithography system. For example, the immersion fluid and its vapor can interfere with the measurement system that monitors the position of the wafer.

SUMMARY

The invention is directed to an environmental system for controlling an environment in a gap between an optical assembly and a device that is retained by a device stage. The environmental system includes a fluid barrier and an immersion fluid system. The fluid barrier is positioned near the device and encircles the gap. The immersion fluid system delivers an immersion fluid that fills the gap.

In one embodiment, the immersion fluid system collects the immersion fluid that is directly between the fluid barrier and at least one of the device and the device stage. In this embodiment, the fluid barrier includes a scavenge inlet that is positioned near the device, and the immersion fluid system includes a low pressure source that is in fluid communication with the scavenge inlet. Additionally, the fluid barrier can confine and contain the immersion fluid and any of the vapor from the immersion fluid in the area near the gap.

In another embodiment, the environmental system includes a bearing fluid source that directs a bearing fluid between the fluid barrier and the device to support the fluid barrier relative to the device. In this embodiment, the fluid barrier includes a bearing outlet that is positioned near the device. Further, the bearing outlet is in fluid communication with the bearing fluid source.

Additionally, the environmental system can include a pressure equalizer that allows the pressure in the gap to be approximately equal to the pressure outside the fluid barrier.

In one embodiment, for example, the pressure equalizer is a channel that extends through the fluid barrier.

Moreover, the device stage can include a stage surface that is in approximately the same plane as an exposed surface of the device. As an example, the device stage can include a device holder that retains the device, a guard that defines the stage surface, and a mover assembly that moves one of the device holder and the guard so that the exposed surface of the device is approximately in the same plane as the stage surface. In one embodiment, the mover assembly moves the guard relative to the device and the device holder. In another embodiment, the mover assembly moves the device holder and the device relative to the guard.

The invention also is directed to an exposure apparatus, a wafer, a device, a method for controlling an environment in a gap, a method for making an exposure apparatus, a method for making a device, and a method for manufacturing a wafer.

BRIEF DESCRIPTION OF THE DRAWINGS

The invention will be described in conjunction with the following drawings of exemplary embodiments in which like reference numerals designate like elements, and in which:

FIG. 2B is a cut-away view taken on line 2B-2B of FIG. 2A;

DETAILED DESCRIPTION OF EMBODIMENTS

Figure 1:
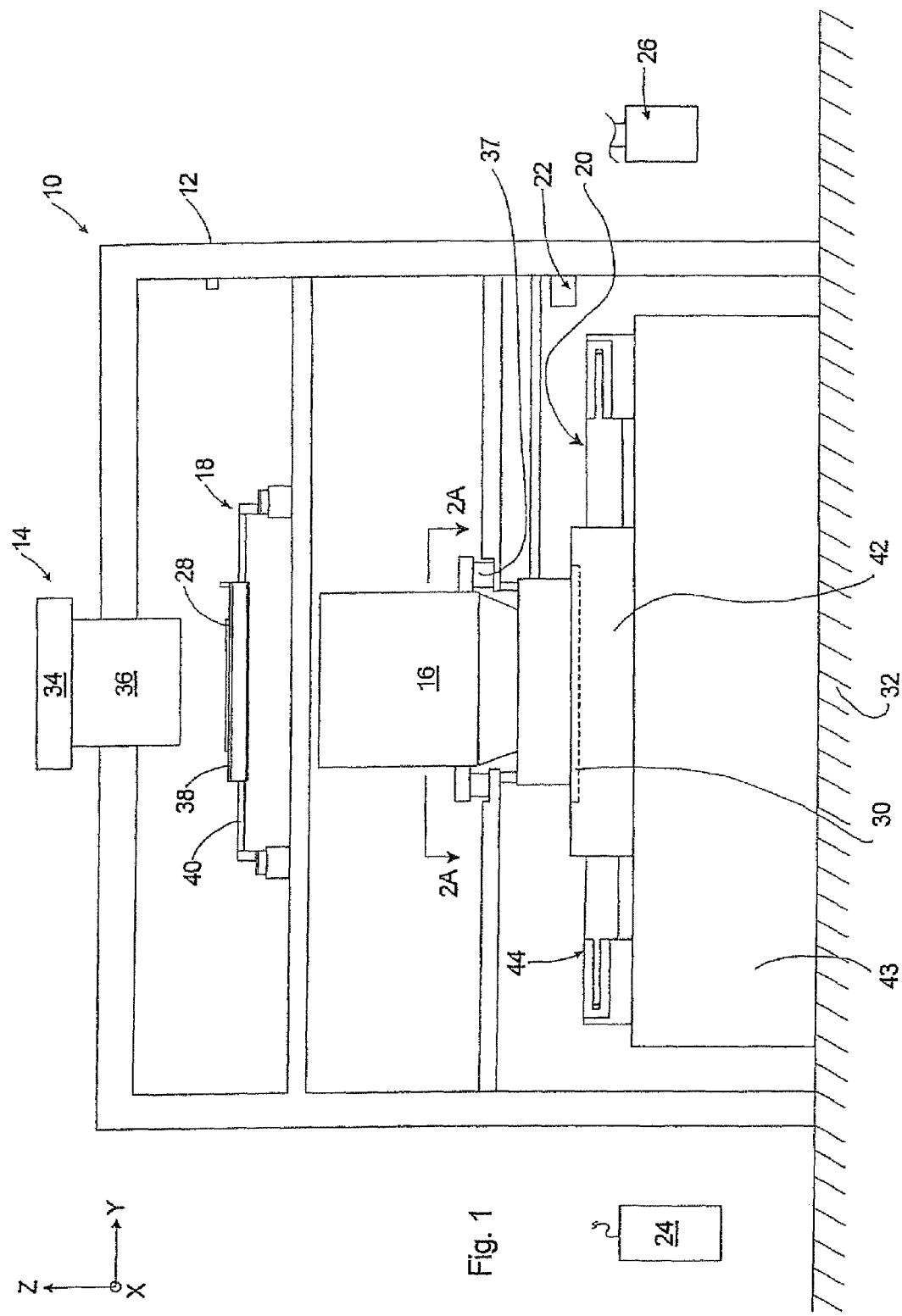
FIG. 1 is a side illustration of an exposure apparatus having features of the invention.

FIG. 1 is a schematic illustration of a precision assembly, namely an exposure apparatus 10 having features of the invention. The exposure apparatus 10 includes an apparatus frame 12, an illumination system 14 (irradiation apparatus), an optical assembly 16, a reticle stage assembly 18, a device stage assembly 20, a measurement system 22, a control system 24, and a fluid environmental system 26. The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 28 onto a semiconductor wafer 30 (illustrated in phantom). The wafer 30 is also referred to generally as a device or work piece. The exposure apparatus 10 mounts to a mounting base 32, e.g., the ground, a base, or floor or some other supporting structure.

There are a number of different types of lithographic devices. For example, the exposure apparatus 10 can be used as a scanning type photolithography system that exposes the pattern from the reticle 28 onto the wafer 30 with the reticle 28 and the wafer 30 moving synchronously. In a scanning type lithographic device, the reticle 28 is moved perpendicularly to an optical axis of the optical assembly 16 by the reticle stage assembly 18 and the wafer 30 is moved perpendicularly to the optical axis of the optical assembly 16 by the wafer stage assembly 20. Irradiation of the reticle 28 and exposure of the wafer 30 occur while the reticle 28 and the wafer 30 are moving synchronously.

Alternatively, the exposure apparatus 10 can be a step-and-repeat type photolithography system that exposes the reticle 28 while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the wafer stage assembly 20 perpendicularly to the optical axis of the optical assembly 16 so that the next field of the wafer 30 is brought into position relative to the optical assembly 16 and the reticle 28 for exposure. Following this process, the images on the reticle 28 are sequentially exposed onto the fields of the wafer 30, and then the next field of the wafer 30 is brought into position relative to the optical assembly 16 and the reticle 28.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 supports the components of the exposure apparatus 10. The apparatus frame 12 illustrated in FIG. 1 supports the reticle stage assembly 18, the wafer stage assembly 20, the optical assembly 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the optical assembly 16. The beam illuminates selectively different portions of the reticle 28 and exposes the wafer 30. In FIG. 1, the illumination source 34 is illustrated as being supported above the reticle stage assembly 18. Typically, however, the illumination source 34 is secured to one of the sides of the apparatus frame 12 and the energy beam from the illumination source 34 is directed to above the reticle stage assembly 18 with the illumination optical assembly 36.

The illumination source 34 can be a light source such as a mercury g-line source (436 nm) or i-line source (365 nm), a KrF excimer laser (248 nm), an ArF excimer laser (193 nm) or a $F_2$ laser (157 nm). The optical assembly 16 projects and/or focuses the light passing through the reticle 28 onto the wafer 30. Depending upon the design of the exposure apparatus 10, the optical assembly 16 can magnify or reduce the image illuminated on the reticle 28. It also could be a 1× magnification system.

When far ultra-violet radiation such as from the excimer laser is used, glass materials such as quartz and fluorite that transmit far ultra-violet rays can be used in the optical assembly 16. The optical assembly 16 can be either catadioptric or refractive.

Also, with an exposure device that employs radiation of wavelength 200 nm or lower, use of the catadioptric type optical system can be considered. Examples of the catadioptric type of optical system are shown in Japanese Laid-Open Patent Application Publication No. 8-171054 and its counterpart U.S. Pat. No. 5,668,672, as well as Japanese Laid-Open Patent Application Publication No. 10-20195 and its counterpart U.S. Pat. No. 5,835,275. In these cases, the reflecting optical device can be a catadioptric optical system incorporating a beam splitter and concave mirror. Japanese Laid-Open Patent Application Publication No. 8-334695 and its counterpart U.S. Pat. No. 5,689,377 as well as Japanese Laid-Open Patent Application Publication No. 10-3039 and its counterpart U.S. Patent Application No. 873,605 (Application Date: Jun. 12, 1997) also use a reflecting-refracting type of optical system incorporating a concave mirror, etc., but without a beam splitter, and can also be employed with this invention. The disclosures of the above-mentioned U.S. patents and application, as well as the Japanese Laid-Open patent applications publications are incorporated herein by reference in their entireties.

In one embodiment, the optical assembly 16 is secured to the apparatus frame 12 with one or more optical mount isolators 37. The optical mount isolators 37 inhibit vibration of the apparatus frame 12 from causing vibration to the optical assembly 16. Each optical mount isolator 37 can include a pneumatic cylinder (not shown) that isolates vibration and an actuator (not shown) that isolates vibration and controls the position with at least two degrees of motion. Suitable optical mount isolators 37 are sold by Integrated Dynamics Engineering, located in Woburn, Mass. For ease of illustration, two spaced apart optical mount isolators 37 are shown as being used to secure the optical assembly 16 to the apparatus frame 12. However, for example, three spaced apart optical mount isolators 37 can be used to kinematically secure the optical assembly 16 to the apparatus frame 12.

The reticle stage assembly 18 holds and positions the reticle 28 relative to the optical assembly 16 and the wafer 30. In one embodiment, the reticle stage assembly 18 includes a reticle stage 38 that retains the reticle 28 and a reticle stage mover assembly 40 that moves and positions the reticle stage 38 and reticle 28.

Somewhat similarly, the device stage assembly 20 holds and positions the wafer 30 with respect to the projected image of the illuminated portions of the reticle 28. In one embodiment, the device stage assembly 20 includes a device stage 42 that retains the wafer 30, a device stage base 43 that supports and guides the device stage 42, and a device stage mover assembly 44 that moves and positions the device stage 42 and the wafer 30 relative to the optical assembly 16 and the device stage base 43. The device stage 42 is described in more detail below.

Each stage mover assembly 40, 44 can move the respective stage 38, 42 with three degrees of freedom, less than three degrees of freedom, or more than three degrees of freedom. For example, in alternative embodiments, each stage mover assembly 40, 44 can move the respective stage 38, 42 with one, two, three, four, five or six degrees of freedom. The reticle stage mover assembly 40 and the device stage mover assembly 44 can each include one or more movers, such as rotary motors, voice coil motors, linear motors utilizing a Lorentz force to generate drive force, electromagnetic movers, planar motors, or other force movers.

Alternatively, one of the stages could be driven by a planar motor that drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage base and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and Japanese Laid-Open Patent Application Publication No. 8-136475. Additionally, reaction forces generated by the reticle (mask) stage motion can be mechanically transferred to the floor (ground) by use of a frame member as described in U.S. Pat. No. 5,874,820 and Japanese Laid-Open Patent Application Publication No. 8-330224. The disclosures of U.S. Pat. Nos. 5,528,100 and 5,874,820 and Japanese Laid-Open Patent Application Publication Nos. 8-136475 and 8-330224 are incorporated herein by reference in their entireties.

The measurement system 22 monitors movement of the reticle 28 and the wafer 30 relative to the optical assembly 16 or some other reference. With this information, the control system 24 can control the reticle stage assembly 18 to precisely position the reticle 28 and the device stage assembly 20 to precisely position the wafer 30. The design of the measurement system 22 can vary. For example, the measurement system 22 can utilize multiple laser interferometers, encoders, mirrors, and/or other measuring devices. The stability of the measurement system 22 is essential for accurate transfer of an image from the reticle 28 to the wafer 30.

The control system 24 receives information from the measurement system 22 and controls the stage mover assemblies 40, 44 to precisely position the reticle 28 and the wafer 30. Additionally, the control system 24 can control the operation of the environmental system 26. The control system 24 can include one or more processors and circuits.

The environmental system 26 controls the environment in a gap 246 (illustrated in FIG. 2B) between the optical assembly 16 and the wafer 30. The gap 246 includes an imaging field 250 (illustrated in FIG. 2A). The imaging field 250 includes the area adjacent to the region of the wafer 30 that is being exposed and the area in which the beam of light energy travels between the optical assembly 16 and the wafer 30. With this design, the environmental system 26 can control the environment in the imaging field 250.

The desired environment created and/or controlled in the gap 246 by the environmental system 26 can vary according to the wafer 30 and the design of the rest of the components of the exposure apparatus 10, including the illumination system 14. For example, the desired controlled environment can be a fluid such as water. The environmental system 26 is described in more detail below.

A photolithography system (an exposure apparatus) according to the embodiments described herein can be built by assembling various subsystems in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there also is a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2A:
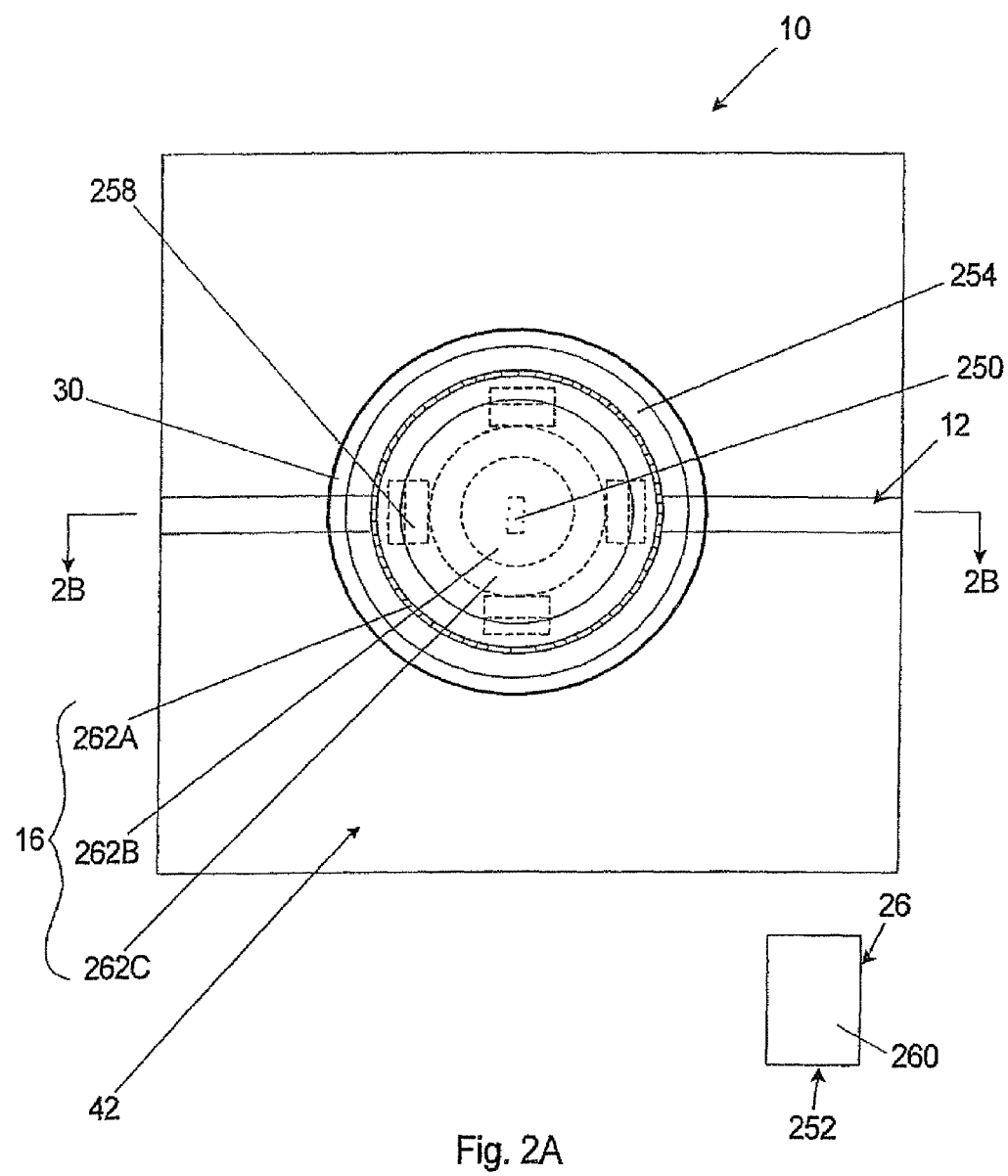
FIG. 2A is a cut-away view taken on line 2A-2A of FIG. 1.

FIG. 2A is a cut-away view taken on line 2A-2A in FIG. 1 that illustrates a portion of the exposure apparatus 10 including the optical assembly 16, the device stage 42, the environmental system 26, and the wafer 30. The imaging field 250 (illustrated in phantom) also is illustrated in FIG. 2A.

In one embodiment, the environmental system 26 fills the imaging field 250 and the rest of the gap 246 (illustrated in FIG. 2B) with an immersion fluid 248 (illustrated in FIG. 2B). As used herein, the term "fluid" shall mean and include a liquid and/or a gas, including any fluid vapor.

The design of the environmental system 26 and the components of the environmental system 26 can be varied. In the embodiment illustrated in FIG. 2A, the environmental system 26 includes an immersion fluid system 252 and a fluid barrier 254. In this embodiment, (i) the immersion fluid system 252 delivers and/or injects the immersion fluid 248 into the gap 246 and captures the immersion fluid 248 flowing from the gap 246, and (ii) the fluid barrier 254 inhibits the flow of the immersion fluid 248 away from near the gap 246.

The design of the immersion fluid system 252 can vary. For example, the immersion fluid system 252 can inject the immersion fluid 248 at one or more locations at or near the gap 246 and/or the edge of the optical assembly 16. Alternatively, the immersion fluid 248 may be injected directly between the optical assembly 16 and the wafer 30. Further, the immersion fluid system 252 can scavenge the immersion fluid 248 at one or more locations at or near the gap 246 and/or the edge of the optical assembly 16. In the embodiment illustrated in FIG. 2A, the immersion fluid system 252 includes four spaced apart injector/scavenge pads 258 (illustrated in phantom) positioned near the perimeter of the optical assembly 16 and an injector/scavenge source 260. These components are described in more detail below.

FIG. 2A also illustrates that the optical assembly 16 includes an optical housing 262A, a last optical element 262B, and an element retainer 262C that secures the last optical element 262B to the optical housing 262A.

FIG. 2B is a cut-away view of the portion of the exposure apparatus 10 of FIG. 2A, including (i) the optical assembly 16 with the optical housing 262A, the last optical element 262B, and the element retainer 262C, (ii) the device stage 42, and (iii) the environmental system 26. FIG. 2B also illustrates the gap 246 between the last optical element 262B and the wafer 30, and that the immersion fluid 248 (illustrated as circles) fills the gap 246. In one embodiment, the gap 246 is approximately 1 mm.

In one embodiment, the fluid barrier 254 contains the immersion fluid 248, including any fluid vapor 249 (illustrated as triangles) in the area near the gap 246 and forms and defines an interior chamber 263 around the gap 246. In the embodiment illustrated in FIG. 2B, the fluid barrier 254 includes a containment frame 264 (also referred to herein as a surrounding member), a seal 266, and a frame support 268. The interior chamber 263 represents the enclosed volume defined by the containment frame 264, the seal 266, the optical housing 262A and the wafer 30. The fluid barrier 254 restricts the flow of the immersion fluid 248 from the gap 246, assists in maintaining the gap 246 full of the immersion fluid 248, allows for the recovery of the immersion fluid 248 that escapes from the gap 246, and contains any vapor 249 produced from the fluid. In one embodiment, the fluid barrier 254 encircles and runs entirely around the gap 246. Further, in one embodiment, the fluid barrier 254 confines the immersion fluid 248 and its vapor 249 to a region on the wafer 30 and the device stage 42 centered on the optical assembly 16.

Containment of both the immersion fluid 248 and its vapor 249 can be important for the stability of the lithography tool. For example, stage measurement interferometers are sensitive to the index of refraction of the ambient atmosphere. For the case of air with some water vapor present at room temperature and 633 nm laser light for the interferometer beam, a change of 1% in relative humidity causes a change in refractive index of approximately $10^{-8}$. For a 1 m total beam path, this can represent an error of 10 nm in stage position. If the immersion fluid 248 is water, a droplet of water 7 mm in diameter evaporating into a 1 m$^3$ volume changes the relative humidity by 1%. Relative humidity is typically monitored and corrected for by the control system 24, but this is based on the assumption that the relative humidity is uniform, so that its value is the same in the interferometer beams as at the monitoring point. However, if droplets of water and its attendant vapor are scattered around on the wafer and stage surfaces, the assumption of uniform relative humidity may not be valid.

In addition to the risk to the interferometer beams, water evaporation may also create temperature control problems. The heat of vaporization of water is about 44 kJ/mole. Evaporation of the 7 mm drop mentioned above will absorb about 430 J which must be supplied by the adjacent surfaces.

Figure 2C:
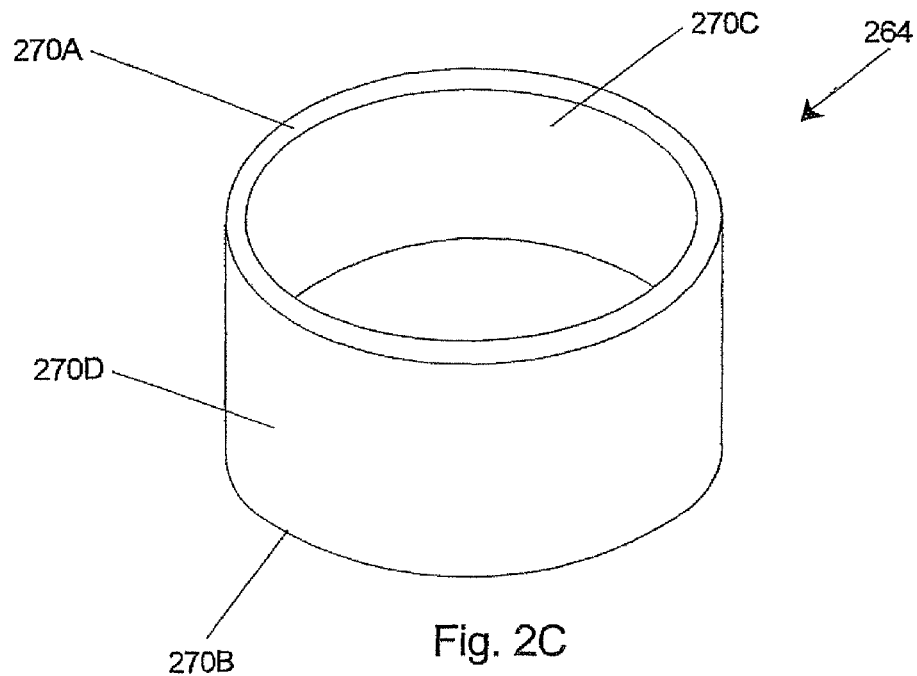
FIG. 2C is a perspective view of a containment frame having features of the invention.

FIG. 2C illustrates a perspective view of one embodiment of the containment frame 264. In this embodiment, the containment frame 264 is annular ring shaped and encircles the gap 246 (illustrated in FIG. 2B). Additionally, in this embodiment, the containment frame 264 includes a top side 270A, an opposite bottom side 270B (also referred to as a first surface) that faces the wafer 30, an inner side 270C that faces the gap 246, and an outer side 270D. The terms top and bottom are used merely for convenience, and the orientation of the containment frame 264 can be rotated. The containment frame 264 can have another shape. Alternatively, for example, the containment frame 264 can be rectangular frame shaped or octagonal frame shaped.

Additionally, as provided herein, the containment frame 264 may be temperature controlled to stabilize the temperature of the immersion fluid 248.

Referring back to FIG. 2B, the seal 266 seals the containment frame 264 to the optical assembly 16 and allows for some motion of the containment frame 264 relative to the optical assembly 16. In one embodiment, the seal 266 is made of a flexible, resilient material that is not influenced by the immersion fluid 248. Suitable materials for the seal 266 include rubber, Buna-N, neoprene, Viton or plastic. Alternatively the seal 266 may be a bellows made of a metal such as stainless steel or rubber or a plastic.

Figure 2D:
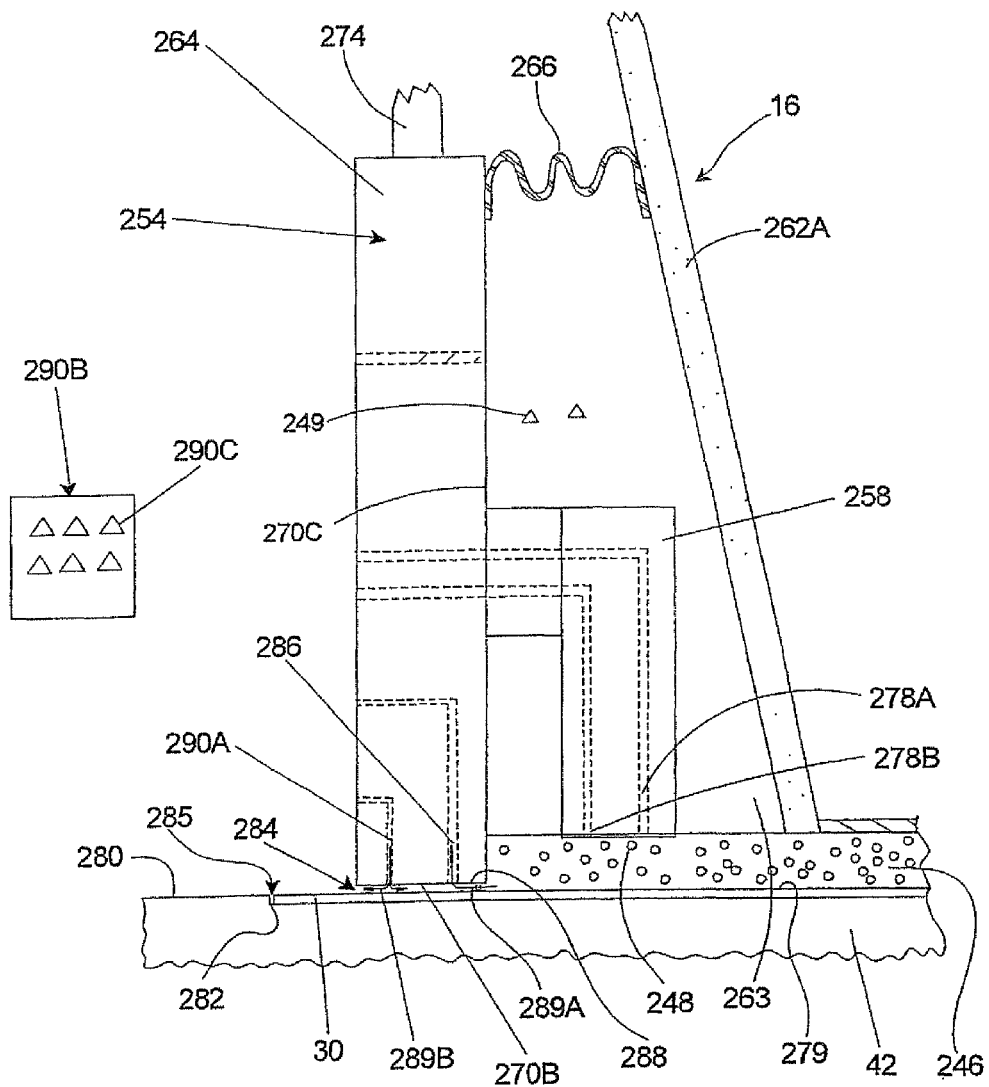
FIG. 2D is an enlarged detailed view taken on line 2D-2D in FIG. 2B.

FIG. 2D illustrates an enlarged view of a portion of FIG. 2B, in partial cut-away. The frame support 268 connects and supports the containment frame 264 to the apparatus frame 12 and the optical assembly 16 above the wafer 30 and the device stage 42. In one embodiment, the frame support 268 supports all of the weight of the containment frame 264. Alternatively, for example, the frame support 268 can support only a portion of the weight of the containment frame 264. In one embodiment, the frame support 268 can include one or more support assemblies 274. For example, the frame support 268 can include three spaced apart support assemblies 274 (only two are illustrated). In this embodiment, each support assembly 274 extends between the apparatus frame 12 and the top side 270A of the containment frame 264.

In one embodiment, each support assembly 274 is a flexure. As used herein, the term "flexure" shall mean a part that has relatively high stiffness in some directions and relatively low stiffness in other directions. In one embodiment, the flexures cooperate (i) to be relatively stiff along the X axis and along the Y axis, and (ii) to be relatively flexible along the Z axis. The ratio of relatively stiff to relatively flexible is at least approximately 100/1, and can be at least approximately 1000/1. Stated another way, the flexures can allow for motion of the containment frame 264 along the Z axis and inhibit motion of the containment frame 264 along the X axis and the Y axis. In this embodiment, each support assembly 274 passively supports the containment frame 264.

Alternatively, for example, each support assembly 274 can be an actuator that can be used to adjust the position of the containment frame 264 relative to the wafer 30 and the device stage 42. Additionally, the frame support 268 can include a frame measurement system 275 that monitors the position of the containment frame 264. For example, the frame measurement system 275 can monitor the position of the containment frame 264 along the Z axis, about the X axis, and/or about the Y axis. With this information, the support assemblies 274 can be used to adjust the position of the containment frame 264. In this embodiment, each support assembly 274 can actively adjust the position of the containment frame 264.

In one embodiment, the environmental system 26 includes one or more pressure equalizers 276 that can be used to control the pressure in the chamber 263. Stated another way, the pressure equalizers 276 inhibit atmospheric pressure changes or pressure changes associated with the fluid control from creating forces between the containment frame 264 and the wafer 30 or the last optical element 262B. For example, the pressure equalizers 276 can cause the pressure on the inside of the chamber 263 and/or in the gap 246 to be approximately equal to the pressure on the outside of the chamber 263. For example, each pressure equalizer 276 can be a channel that extends through the containment frame 264. In one embodiment, a tube 277 (only one is illustrated) is attached to the channel of each pressure equalizer 276 to convey any fluid vapor away from the measurement system 22 (illustrated in FIG. 1). In alternative embodiments, the pressure equalizer 276 allows for a pressure difference of less than approximately 0.01, 0.05, 0.1, 0.5, or 1.0 PSI.

FIG. 2B also illustrates several injector/scavenge pads 258. FIG. 2D illustrates one injector/scavenge pad 258 in more detail. In this embodiment, each of the injector/scavenge pads 258 includes a pad outlet 278A and a pad inlet 278B that are in fluid communication with the injector/scavenge source 260. At the appropriate time, the injector/scavenge source 260 provides immersion fluid 248 to the pad outlet 278A that is released into the chamber 263 and draws immersion fluid 248 through the pad inlet 278B from the chamber 263.

FIGS. 2B and 2D also illustrate that the immersion fluid 248 in the chamber 263 sits on top of the wafer 30. As the wafer 30 moves under the optical assembly 16, it will drag the immersion fluid 248 in the vicinity of a top, device surface 279 of the wafer 30 with the wafer 30 into the gap 246.

In one embodiment, referring to FIGS. 2B and 2D, the device stage 42 includes a stage surface 280 that has approximately the same height along the Z axis as the top, exposed surface 279 of the wafer 30. Stated another way, in one embodiment, the stage surface 280 is in approximately the same plane as the exposed surface 279 of the wafer 30. In alternative embodiments, for example, approximately the same plane shall mean that the planes are within approximately 1, 10, 100 or 500 microns. As a result thereof, the distance between the bottom side 270B of the containment frame 264 and the wafer 30 is approximately equal to the distance between the bottom side 270B of the containment frame 264 and the device stage 42. In one embodiment, for example, the device stage 42 can include a disk shaped recess 282 for receiving the wafer 30. Some alternative designs of the device stage 42 are discussed below.

FIG. 2D illustrates that a frame gap 284 exists between the bottom side 270B of the containment frame 264 and the wafer 30 and/or the device stage 42 to allow for ease of movement of the device stage 42 and the wafer 30 relative to the containment frame 264. The size of the frame gap 284 can vary. For example, the frame gap 284 can be between approximately 5 µm and 3 mm. In alternative examples, the frame gap 284 can be approximately 5, 10, 50, 100, 150, 200, 250, 300, 400, or 500 microns.

In certain embodiments, the distance between the bottom side 270B and at least one of the wafer 30 and/or the device stage 42 is shorter than a distance between the end surface (e.g., the last optical element 262B or the bottom of the optical housing 262A) of the optical assembly 16 and at least one of the wafer 30 and/or the device stage 42.

Additionally, a wafer gap 285 can exist between the edge of the wafer 30 and the wafer stage 42. In one embodiment, the wafer gap 285 is as narrow as possible to minimize leakage when the wafer 30 is off-center from the optical assembly 16 and lying partly within and partly outside the fluid containment frame 264 region. For example, in alternative embodiments, the wafer gap 285 can be approximately 1, 10, 50, 100, 500, or 1000 microns.

FIG. 2D also illustrates that some of the immersion fluid 248 flows between the containment frame 264 and the wafer 30 and/or the device stage 42. In one embodiment, the containment frame 264 includes one or more scavenge inlets 286 that are positioned at or near the bottom side 270B of the containment frame 264. The one or more scavenge inlets 286 are in fluid communication with the injector/scavenge source 260 (illustrated in FIG. 2B). With this design, the immersion fluid 248 that escapes in the frame gap 284 can be scavenged by the injector/scavenge source 260. In the embodiment illustrated in FIG. 2D, the bottom side 270B of the containment frame 264 includes one scavenge inlet 286 that is substantially annular groove shaped and is substantially concentric with the optical assembly 16. Alternatively, for example, the bottom side 270B of the containment frame 264 can include a plurality of spaced apart annular groove shaped, scavenge inlets 286 that are substantially concentric with the optical assembly 16 to inhibit the immersion fluid 248 from completely exiting the frame gap 284. Still alternatively, a plurality of spaced apart apertures oriented in a circle can be used instead of an annular shaped groove.

In one embodiment, the injector/scavenge source 260 applies a vacuum and/or partial vacuum on the scavenge inlet 286. The partial vacuum draws the immersion fluid 248 between (i) a small land area 288 on the bottom side 270B, and (ii) the wafer 30 and/or the device stage 42. The immersion fluid 248 in the frame gap 284 acts as a fluid bearing 289A (illustrated as an arrow) that supports the containment frame 264 above the wafer 30 and/or the device stage 42, allows for the containment frame 264 to float with minimal friction on the wafer 30 and/or the device stage 42, and allows for a relatively small frame gap 284. With this embodiment, most of the immersion fluid 248 is confined within the fluid barrier 254 and most of the leakage around the periphery is scavenged within the narrow frame gap 284.

Additionally, the environmental system 26 can include a device for creating an additional fluid bearing 289B (illustrated as an arrow) between the containment frame 264 and the wafer 30 and/or the device stage 42. For example, the containment frame 264 can include one or more bearing outlets 290A that are in fluid communication with a bearing fluid source 290B of a bearing fluid 290C (illustrated as triangles). In one embodiment, the bearing fluid 290C is air. In this embodiment, the bearing fluid source 290B provides pressurized air 290C to the bearing outlet 290A to create the aerostatic bearing 289B. The fluid bearings 289A, 289B can support all or a portion of the weight of the containment frame 264. In alternative embodiments, one or both of the fluid bearings 289A, 289B support approximately 1, 5, 10, 20, 30, 40, 50, 60, 70, 80, 90, or 100 percent of the weight of the containment frame 264. In one embodiment, the concentric fluid bearings 289A, 289B are used to maintain the frame gap 284.

Depending upon the design, the bearing fluid 290C can have the same composition or a different composition than the immersion fluid 248. However, some of the bearing fluid 290C may escape from the fluid barrier 254. In one embodiment, the type of bearing fluid 290C is chosen so that the bearing fluid 290C and its vapor do not interfere with the measurement system 22 or temperature stability of the exposure apparatus 10.

In another embodiment, the partial vacuum in the scavenge inlets 286 pulls and urges the containment frame 264 toward the wafer 30. In this embodiment, the fluid bearing 289B supports part of the weight of the containment frame 264 as well as opposes the pre-load imposed by the partial vacuum in the scavenge inlets 286.

In addition, the pressurized air 290C helps to contain the immersion fluid 248 within the containment frame 264. As provided above, the immersion fluid 248 in the frame gap 284 is mostly drawn out through the scavenge inlets 286. In this embodiment, any immersion fluid 248 that leaks beyond the scavenge inlets 286 is pushed back to the scavenge inlets 286 by the bearing fluid 290C.

The frame gap 284 may vary radially, from the inner side 270C to the outer side 270D, to optimize bearing and scavenging functions.

In FIG. 2D, the bearing outlet 290A is substantially annular groove shaped, is substantially concentric with the optical assembly 16 and the scavenge inlet 286, and has a diameter that is greater than the diameter of the scavenge inlet 286. Alternatively, for example, the bottom side 270B of the containment frame 264 can include a plurality of spaced apart annular groove shaped, bearing outlets 290A that are substantially concentric with the optical assembly 16. Still alternatively, a plurality of spaced apart apertures oriented in a circle can be used instead of an annular shaped groove. Alternatively, for example, a magnetic type bearing could be used to support the containment frame 264.

Figure 2E:
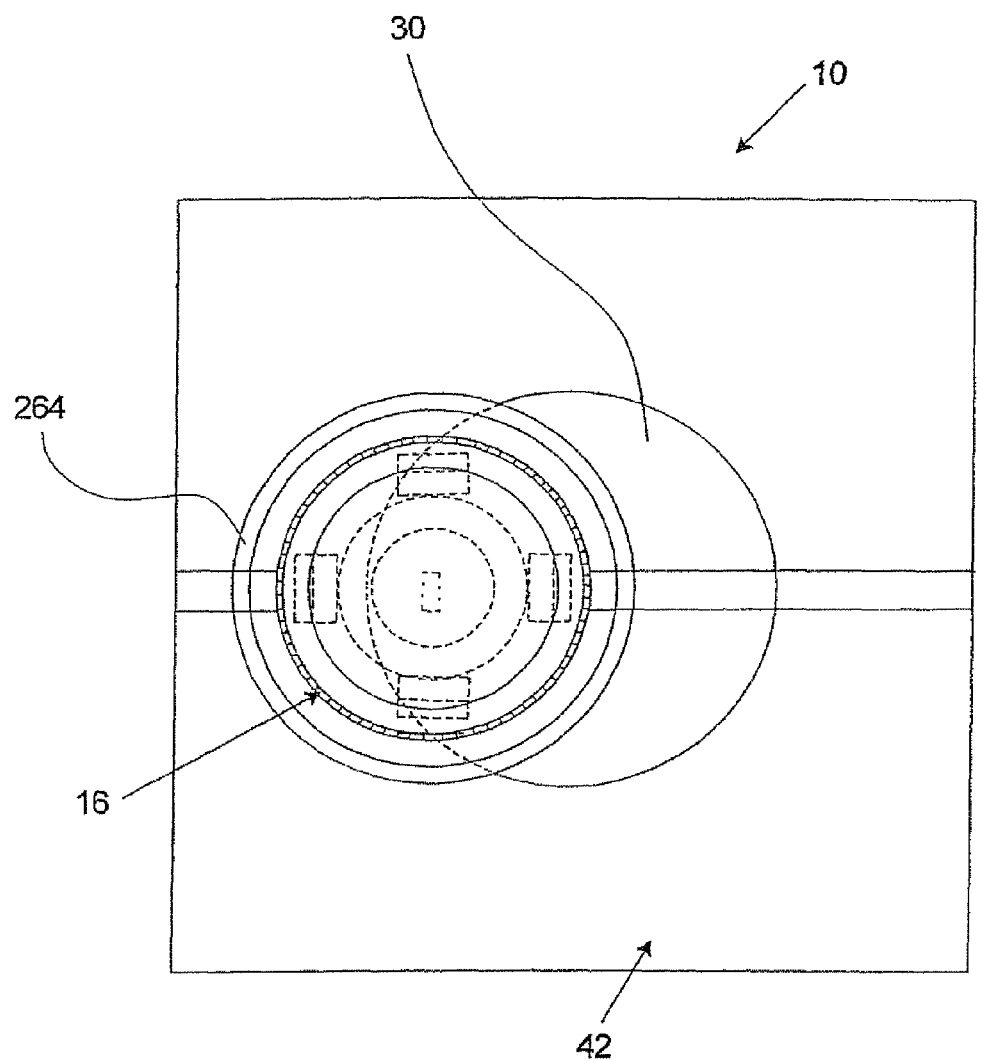
FIG. 2E is an illustration of the portion of the exposure apparatus of FIG. 2A with a wafer stage moved relative to an optical assembly.

As illustrated in FIGS. 2B and 2D, the wafer 30 is centered under the optical assembly 16. In this position, the fluid bearings 289A, 289B support the containment frame 264 above the wafer 30. FIG. 2E is an illustration of the portion of the exposure apparatus 10 of FIG. 2A with the device stage 42 and the wafer 30 moved relative to the optical assembly 16. In this position, the wafer 30 and the device stage 42 are no longer centered under the optical assembly 16, and the fluid bearings 289A, 289B (illustrated in FIG. 2D) support the containment frame 264 above the wafer 30 and the device stage 42.

Figure 3:
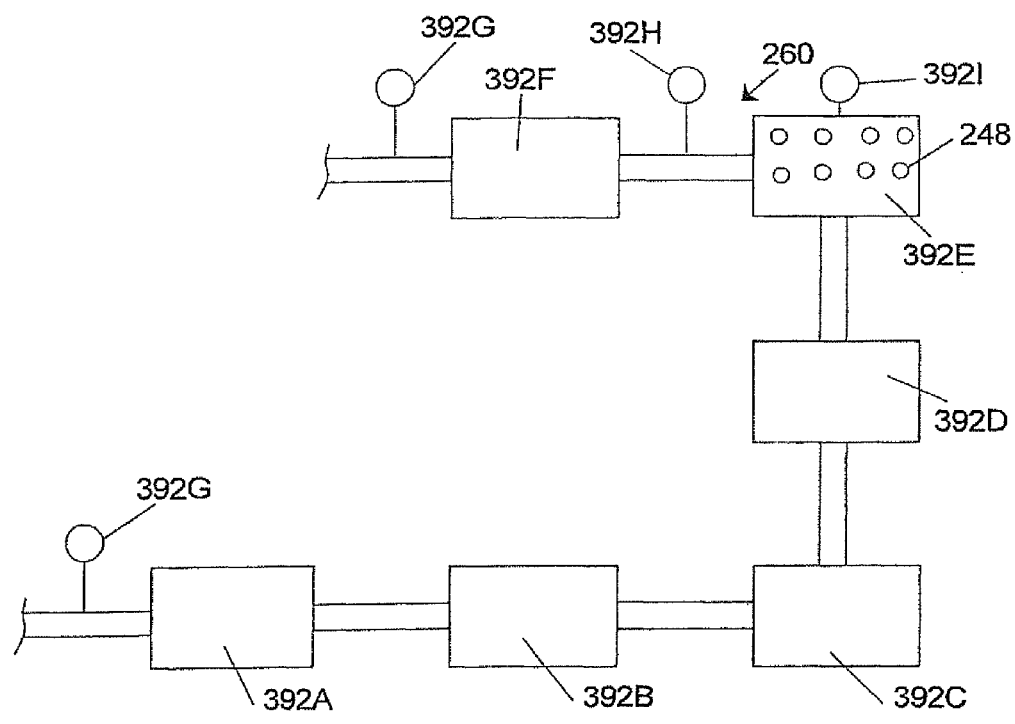
FIG. 3 is a side illustration of an injector/scavenge source having features of the invention.

FIG. 3 is a first embodiment of the injector/scavenge source 260. In this embodiment, the injector/scavenge source 260 includes (i) a low pressure source 392A, e.g. a pump, having an inlet that is at a vacuum or partial vacuum that is in fluid communication with the scavenge inlet 286 (illustrated in FIG. 2D) and the pad inlets 278B (illustrated in FIGS. 2B and 2D) and a pump outlet that provides pressurized immersion fluid 248, (ii) a filter 392B in fluid communication with the pump outlet and that filters the immersion fluid 248, (iii) a de-aerator 392C in fluid communication with the filter 392B and that removes any air, contaminants, or gas from the immersion fluid 248, (iv) a temperature control 392D in fluid communication with the de-aerator 392C and that controls the temperature of the immersion fluid 248, (v) a reservoir 392E in fluid communication with the temperature control 392D and that retains the immersion fluid 248, and (vi) a flow controller 392F that has an inlet in fluid communication with the reservoir 392E and an outlet in fluid communication with the pad outlets 278A (illustrated in FIGS. 2B and 2D), the flow controller 392F controlling the pressure and flow to the pad outlets 278A. The operation of these components can be controlled by the control system 24 (illustrated in FIG. 1) to control the flow rate of the immersion fluid 248 to the pad outlets 278A, the temperature of the immersion fluid 248 at the pad outlets 278A, the pressure of the immersion fluid 248 at the pad outlets 278A, and/or the pressure at the scavenge inlets 286 and the pad inlets 278B.

Additionally, the injector/scavenge source 260 can include (i) a pair of pressure sensors 392G that measure the pressure near the pad outlets 278A, the scavenge inlets 286 and the pad inlets 278B, (ii) a flow sensor 392H that measures the flow to the pad outlets 278A, and/or (iii) a temperature sensor 392I that measures the temperature of the immersion fluid 248 delivered to the pad outlets 278A. The information from these sensors 392G-392I can be transferred to the control system 24 so that that control system 24 can appropriately adjust the other components of the injector/scavenge source 260 to achieve the desired temperature, flow and/or pressure of the immersion fluid 248.

The orientation of the components of the injector/scavenge source 260 can be varied. Further, one or more of the components may not be necessary and/or some of the components can be duplicated. For example, the injector/scavenge source 260 can include multiple pumps, multiple reservoirs, temperature controllers or other components. Moreover, the environmental system 26 can include multiple injector/scavenge sources 260.

The rate at which the immersion fluid 248 is pumped into and out of the chamber 263 (illustrated in FIG. 2B) can be adjusted to suit the design requirements of the system. Further, the rate at which the immersion fluid 248 is scavenged from the pad inlets 278B and the scavenge inlets 286 can vary. In one embodiment, the immersion fluid 248 is scavenged from the pad inlets 278B at a first rate and is scavenged from the scavenge inlets 286 at a second rate. As an example, the first rate can be between approximately 0.1-5 liters/minute and the second rate can be between approximately 0.01-0.5 liters/minute. However, other first and second rates can be utilized.

The rates at which the immersion fluid 248 is pumped into and out of the chamber 263 can be adjusted to (i) control the leakage of the immersion fluid 248 below the fluid barrier, (ii) control the leakage of the immersion fluid 248 from the wafer gap 285 when the wafer 30 is off-center from the optical assembly 16, and/or (iii) control the temperature and purity of the immersion fluid 248 in the gap 246. For example, the rates can be increased in the event the wafer 30 is off-center, the temperature of the immersion fluid 248 becomes too high and/or there is an unacceptable percentage of contaminants in the immersion fluid 248 in the gap 246.

The type of immersion fluid 248 can be varied to suit the design requirements of the apparatus 10. In one embodiment, the immersion fluid 248 is water. Alternatively, for example, the immersion fluid 248 can be a fluorocarbon fluid, Fomblin oil, a hydrocarbon oil, or another type of oil. More generally, the fluid should satisfy certain conditions: 1) it must be relatively transparent to the exposure radiation; 2) its refractive index must be comparable to that of the last optical element 262B; 3) it should not react chemically with components of the exposure system 10 with which it comes into contact; 4) it must be homogeneous; and 5) its viscosity should be low enough to avoid transmitting vibrations of a significant magnitude from the stage system to the last optical element 262B.

Figure 4A:
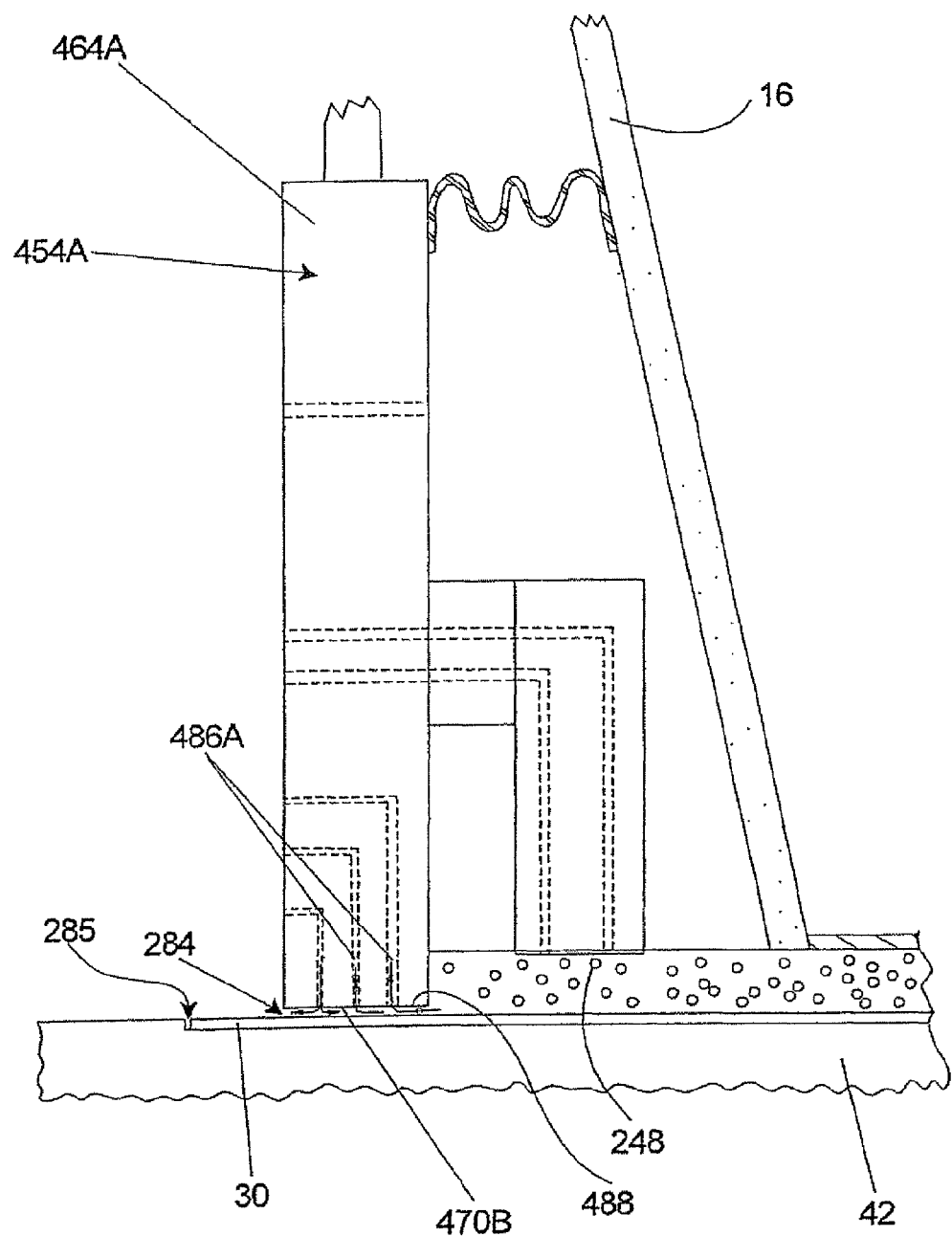
FIG. 4A is an enlarged detailed view of a portion of another embodiment of a fluid barrier.

FIG. 4A is an enlarged view of a portion of another embodiment of the fluid barrier 454A, a portion of the wafer 30, and a portion of the device stage 42. In this embodiment, the fluid barrier 454A is somewhat similar to the corresponding component described above and illustrated in FIG. 2D. However, in this embodiment, the containment frame 464A includes two concentric, scavenge inlets 486A that are positioned at the bottom side 470B of the containment frame 464A. The two scavenge inlets 486A are in fluid communication with the injector/scavenge source 260 (illustrated in FIG. 2B). With this design, the immersion fluid 248 that escapes in the frame gap 284 can be scavenged by the injector/scavenge source 260. In this embodiment, the bottom side 470B of the containment frame 464 includes two scavenge inlets 486A that are each substantially annular groove shaped and are substantially concentric with the optical assembly 16.

With this design, the injector/scavenge source 260 applies a vacuum or partial vacuum on the scavenge inlets 486A. The partial vacuum draws the immersion fluid 248 between a small land area 488 on the bottom side 470B and the wafer 30 and/or the device stage 42. In this embodiment, the majority of the immersion fluid 248 flows under the land 488 and into the inner scavenge inlet 486A. Additionally, the immersion fluid 248 not removed at the inner scavenge inlet 486A is drawn into the outer scavenge inlet 486A.

Figure 4B:
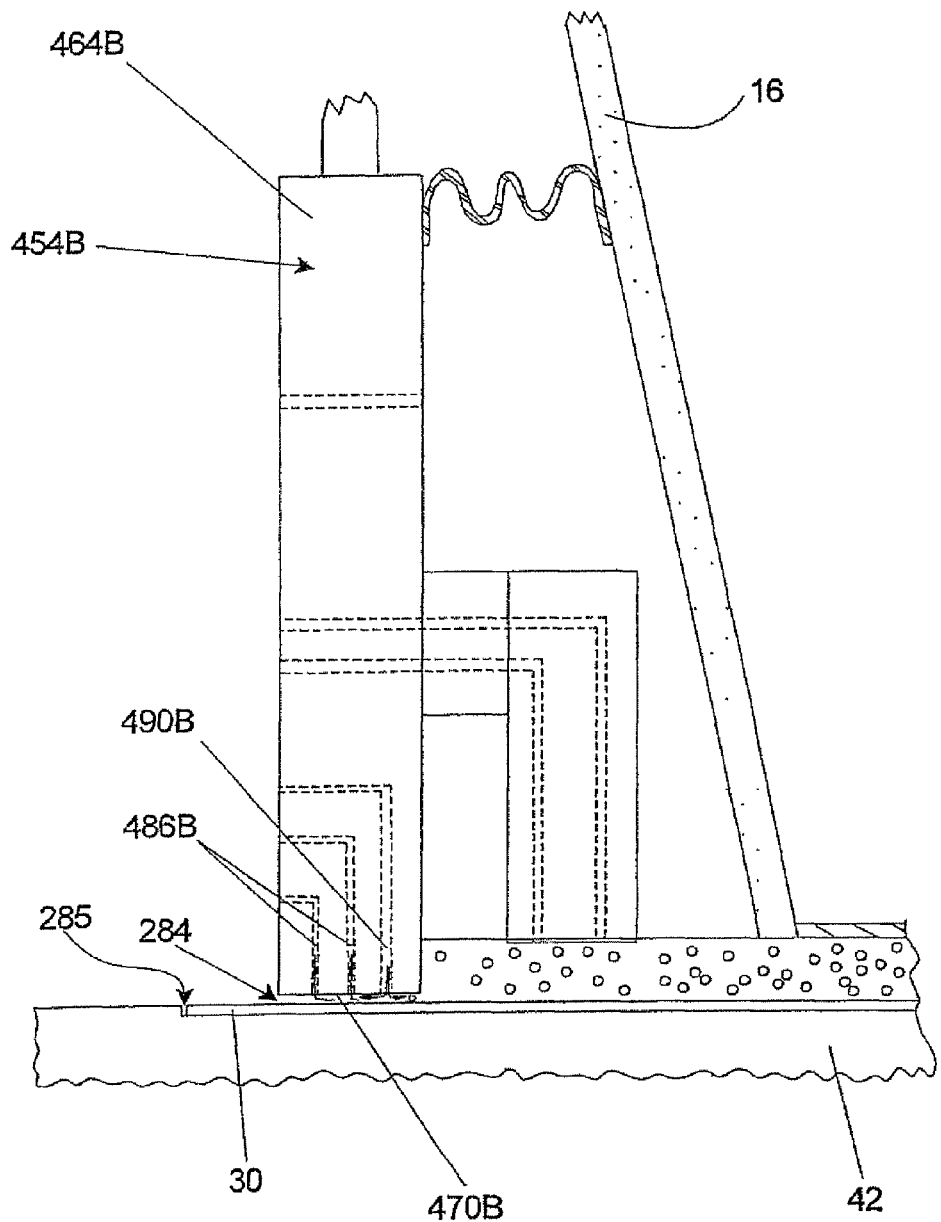
FIG. 4B is an enlarged detailed view of a portion of another embodiment of a fluid barrier.

FIG. 4B is an enlarged view of a portion of another embodiment of the fluid barrier 454B, a portion of the wafer 30, and a portion of the device stage 42. In this embodiment, the fluid barrier 454B is somewhat similar to the corresponding component described above and illustrated in FIG. 2D. However, in this embodiment, the containment frame 464B includes one bearing outlet 490B and two scavenge inlets 486B that are positioned at the bottom side 470B. The scavenge inlets 486B are in fluid communication with the injector/scavenge source 260 (illustrated in FIG. 2B) and the bearing outlet 490B is in fluid communication with the bearing fluid source 290B (illustrated in FIG. 2D). However, in this embodiment, the bearing outlet 490B is positioned within and concentric with the scavenge inlets 486B. Stated another way, the bearing outlet 490B has a smaller diameter than the scavenge inlets 486B, and the bearing outlet 490B is closer to the optical assembly 16 than the scavenge inlets 486B. Further, with this design, the bearing fluid 290C (illustrated in FIG. 2D) can be a liquid that is the same in composition as the immersion fluid 248. With this design, the bearing fluid 290C in the frame gap 284 can be scavenged by the injector/scavenge source 260 via the scavenge inlets 486B.

Figure 4C:
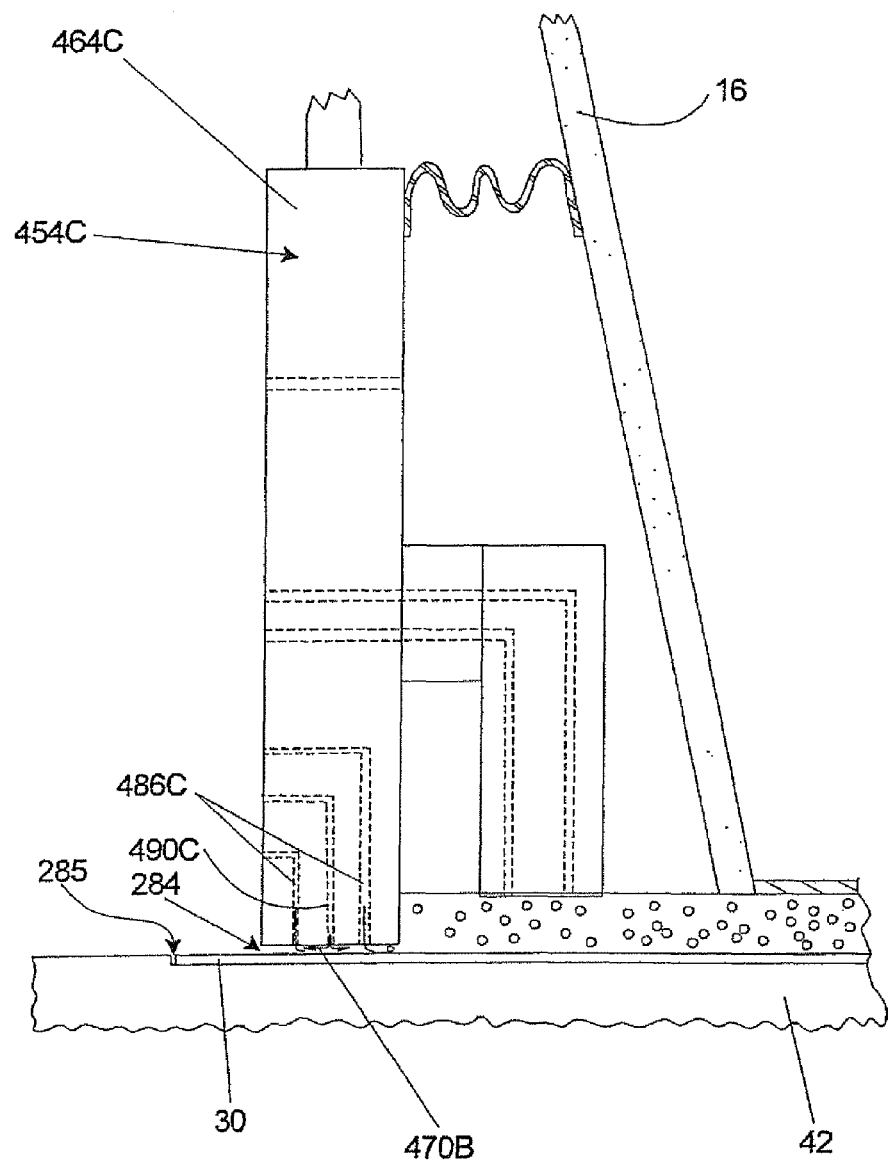
FIG. 4C is an enlarged detailed view of a portion of another embodiment of a fluid barrier.

FIG. 4C is an enlarged view of a portion of another embodiment of the fluid barrier 454C, a portion of the wafer 30, and a portion of the device stage 42. In this embodiment, the fluid barrier 454C is somewhat similar to the corresponding component described above and illustrated in FIG. 2D. However, in this embodiment, the containment frame 464C includes one bearing outlet 490C and two scavenge inlets 486C that are positioned at the bottom side 470B. The scavenge inlets 486C are in fluid communication with the injector/scavenge source 260 (illustrated in FIG. 2B) and the bearing outlet 490C is in fluid communication with the bearing fluid source 290B (illustrated in FIG. 2D). However, in this embodiment, the bearing outlet 490C is positioned between the two scavenge inlets 486C. Stated another way, the inner scavenge inlet 486C has a smaller diameter than the bearing outlet 490C, and the bearing outlet 490C has a smaller diameter than the outer scavenge inlet 486C. With this design, the inner scavenge inlet 486C is closer to the optical assembly 16 than the bearing outlet 490C.

It should be noted that in each embodiment, additional scavenge inlets and addition bearing outlets can be added as necessary.

Figure 5A:
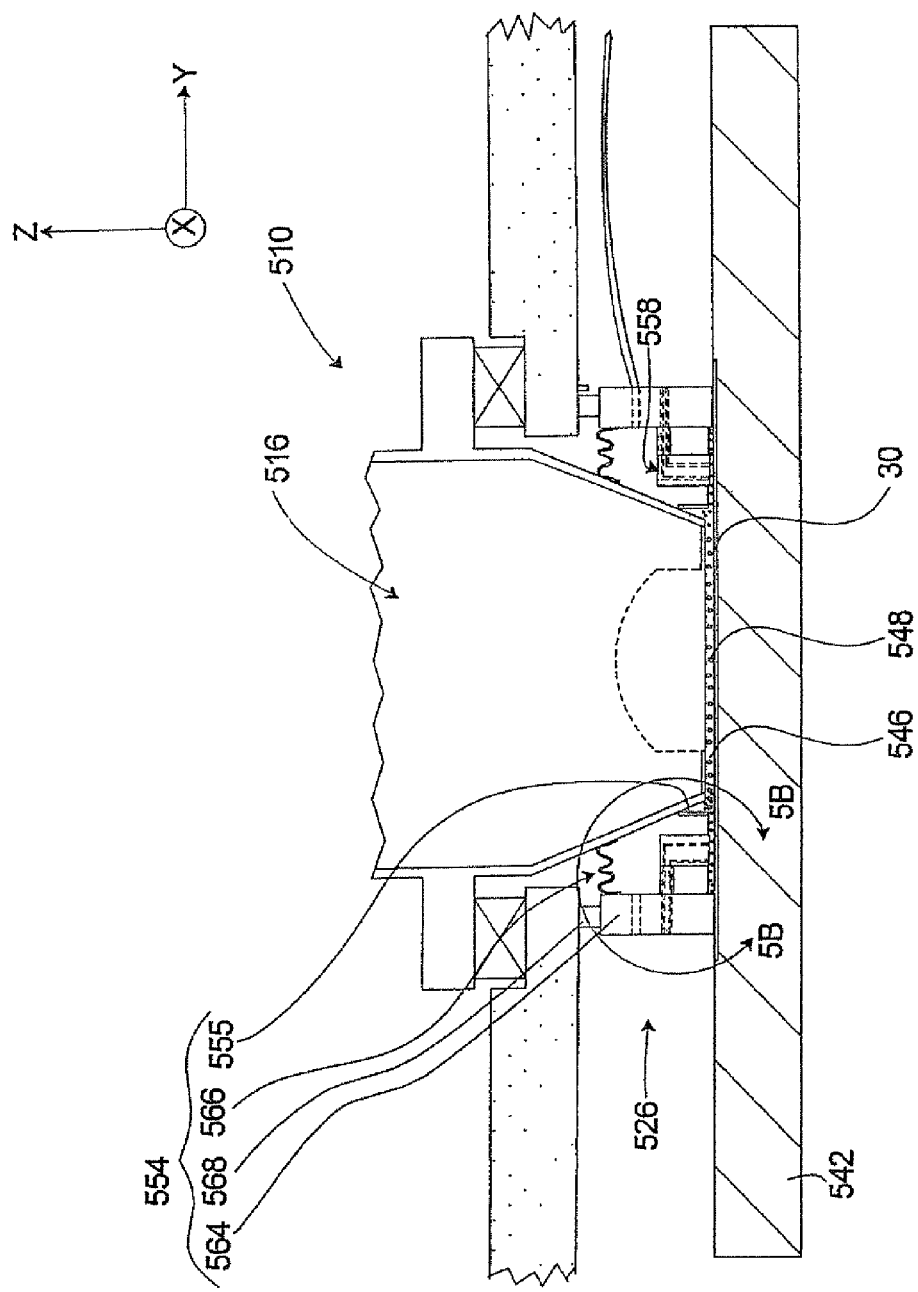
FIG. 5A is a cut-away view of a portion of another embodiment of an exposure apparatus.
Figure 5B:
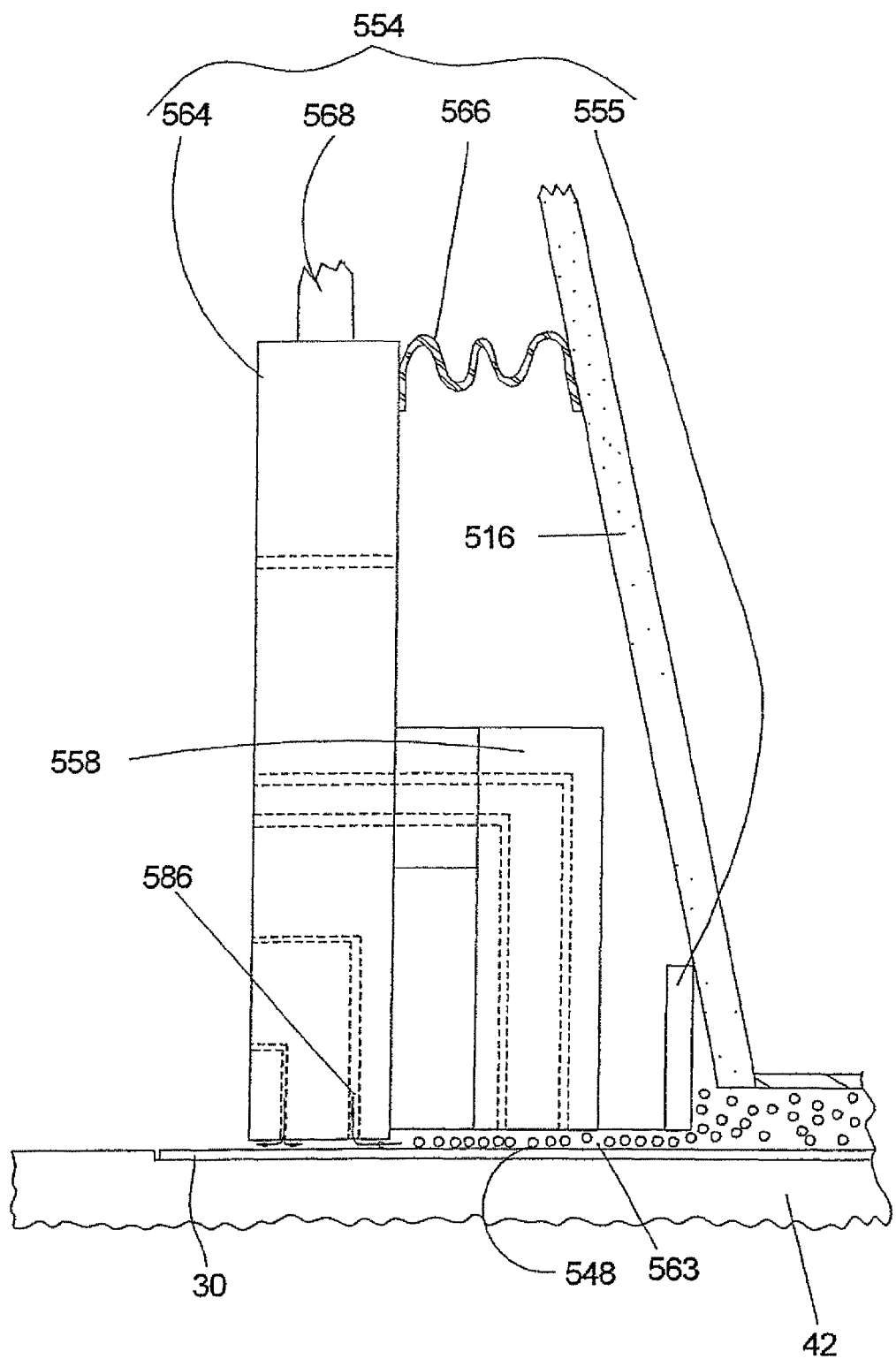
FIG. 5B is an enlarged detailed view taken on line 5B-5B in FIG. 5A.

FIG. 5A is a cut-away view of a portion of another embodiment of the exposure apparatus 510, including the optical assembly 516, the device stage 542, and the environmental system 526 that are similar to the corresponding components described above. FIG. 5A also illustrates the wafer 30, the gap 546, and that the immersion fluid 548 fills the gap 546. FIG. 5B illustrates an enlarged portion of FIG. 5A taken on line 5B-5B.

However, in the embodiment illustrated in FIGS. 5A and 5B, the fluid barrier 554 includes an inner barrier 555 in addition to the containment frame 564, the seal 566, and the frame support 568. In this embodiment, the inner barrier 555 is annular ring shaped, encircles the bottom of the optical assembly 516, is concentric with the optical assembly 516, and is positioned within the containment frame 564 adjacent to the seal 566.

The inner barrier 555 can serve several purposes. For example, the inner barrier 555 can limit the amount of immersion fluid 548 escaping to the containment frame 564, reducing the scavenging requirements at the scavenge inlets 586, and also reducing the leakage of immersion fluid 548 into the wafer gap 285 when the wafer 30 is off-center from the optical assembly 516 and lying partly within and partly outside the fluid containment frame 564 region. With this design, the fluid injection/scavenge pads 558 can be used to recover the majority of the immersion fluid 548 from the chamber 563. Additionally, if the immersion fluid 548 is maintained at or near the level of the top of the inner barrier 555, pressure surges associated with injection of the immersion fluid 548 can be reduced, because excess immersion fluid 548 overflows the top of the inner barrier 555, creating a static pressure head. Some pressure surge may remain even in this situation due to surface tension effects. These effects can be reduced by increasing the height of the inner barrier 555 shown in FIG. 5B. For example, if the immersion fluid is water, the height should preferably be several mm or more. Additionally, the remaining pressure surge can be reduced or eliminated by adjusting the "wettability" of the surfaces of inner barrier 555 and optical assembly 516 in contact with the immersion fluid 548 to reduce surface tension forces. In one embodiment, the inner barrier 555 can maintain a significant fluid height difference with a gap of approximately 50 μm between the bottom of the inner barrier 55 and the top of the wafer 30 or the device stage 42.

Figure 6:
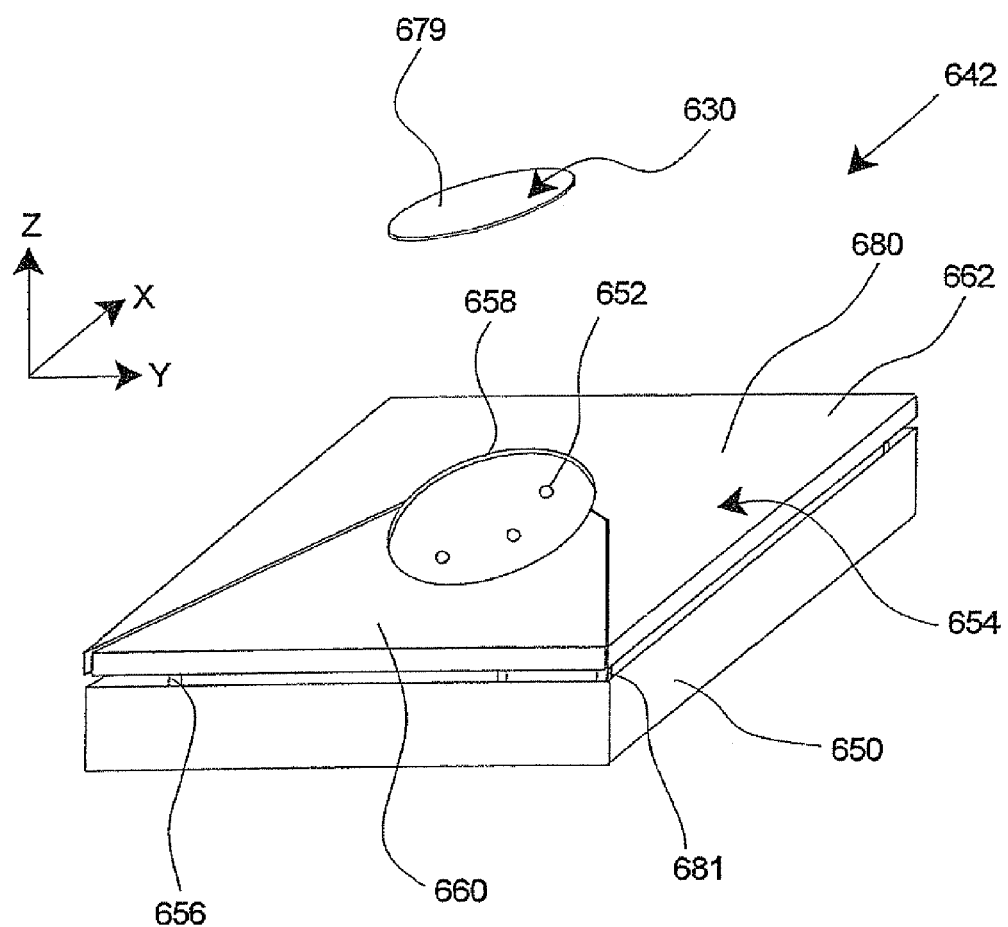
FIG. 6 is a perspective view of one embodiment of a device stage having features of the invention.

FIG. 6 is a perspective view of one embodiment of a device stage 642 with a wafer 630 positioned above the device stage 642. In this embodiment, the device stage 642 includes a device table 650, a device holder 652, a guard 654, and a guard mover assembly 656. In this embodiment, the device table 650 is generally rectangular plate shaped. The device holder 652 retains the wafer 630. In this embodiment, the device holder 652 is a chuck or another type of clamp that is secured to the device table 650. The guard 654 surrounds and/or encircles the wafer 630. In one embodiment, the guard 654 is generally rectangular plate shaped and includes a circular shaped aperture 658 for receiving the wafer 630.

In one embodiment, the guard 654 can include a first section 660 and a second section 662. One or more of the sections 660, 662 can be moved, removed or recessed to provide easy access for loading and removing the wafer 630.

The guard mover assembly 656 secures the guard 654 to the device table 650, and moves and positions the guard 654 relative to the device table 650, the device holder 652, and the wafer 630. With this design, the guard mover assembly 656 can move the guard 654 so that the top, stage surface 680 of the guard 654 is approximately at the same Z height as the top exposed surface 679 of the wafer 630. Stated another way, the guard mover assembly 656 moves the guard 654 so that the stage surface 680 is approximately in the same plane as the exposed surface 679 of the wafer 630. As a result thereof, the guard 654 can be moved to adjust for wafers 630 of alternative heights.

The design of the guard mover assembly 656 can be varied. For example, the guard mover assembly 656 can include one or more rotary motors, voice coil motors, linear motors, electromagnetic actuators, and/or other type of force actuators. In one embodiment, the guard mover assembly 656 moves and positions the guard 654 along the Z axis, about the X axis and about the Y axis under the control of the control system 24 (illustrated in FIG. 1). A sensor 681 (illustrated as a box) can be used to measure the relative heights of the guard surface 680 and the wafer top surface 679. Information from the sensor 681 can be transferred to the control system 24 (illustrated in FIG. 1) which uses information from the height sensor 681 to control the guard mover assembly 656.

Figure 7A:
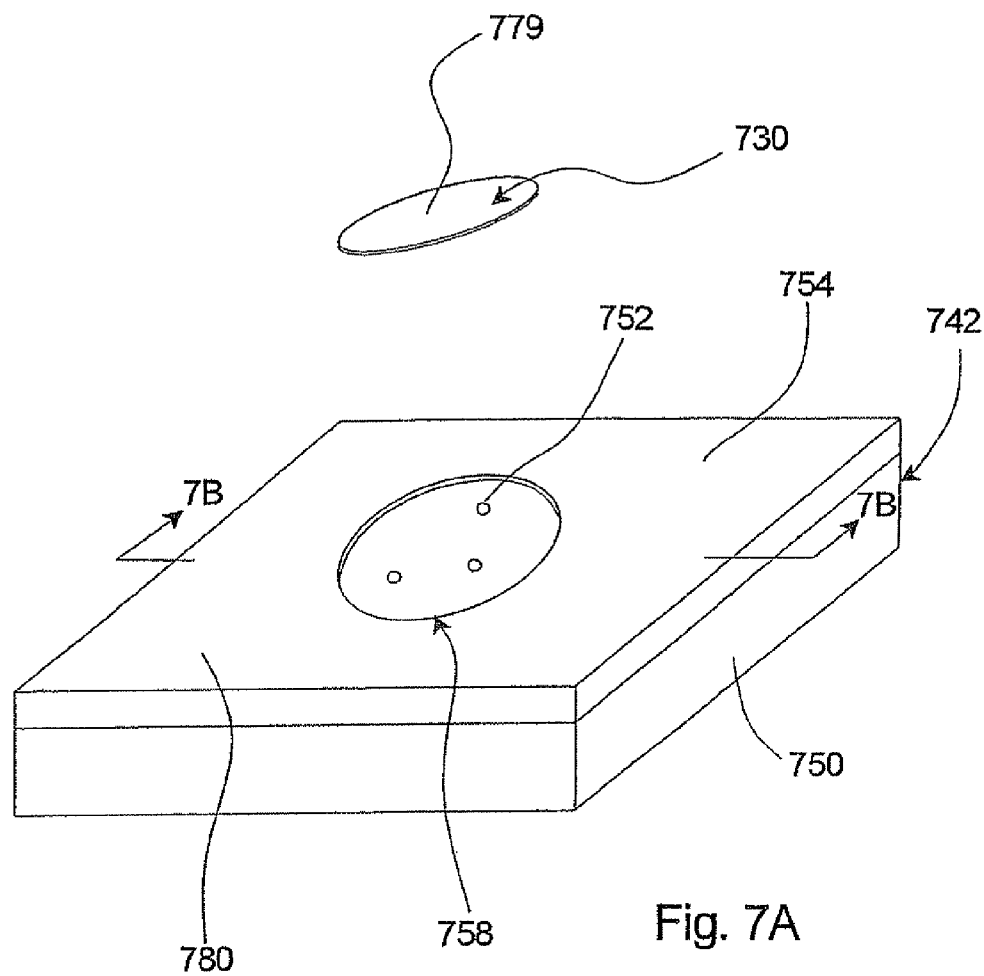
FIG. 7A is a perspective view of another embodiment of a device stage having features of the invention.
Figure 7B:
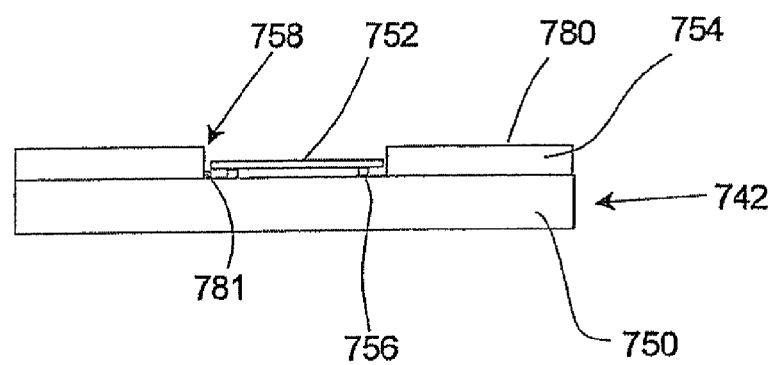
FIG. 7B is a cut-away view taken on line 7B-7B in FIG. 7A.

FIG. 7A is a perspective view of another embodiment of a device stage 742 with a wafer 730 positioned above the device stage 742. FIG. 7B is a cut-away view taken from FIG. 7A. In this embodiment, the device stage 742 includes a device table 750, a device holder 752, a guard 754, and a holder mover assembly 756. In this embodiment, the device table 750 is generally rectangular plate shaped. The device holder 752 retains the wafer 730. The guard 754 is generally rectangular plate shaped and includes a circular shaped aperture 758 for the wafer 730. In this embodiment, the guard 754 is fixedly secured to the device table 750. The holder mover assembly 756 secures the device holder 752 to the device table 750 and moves and positions the device holder 752 relative to the device table 750 and the guard 754. With this design, the holder mover assembly 756 can move the device holder 752 and the wafer 730 so that the top stage surface 780 of the guard 754 is approximately at the same Z height as the top exposed surface 779 of the wafer 730. A sensor 781 can be used to measure the relative heights of the top stage surface 780 and the top exposed surface 779 of the wafer 730. The information from the sensor 781 can be transferred to the control system 24 (illustrated in FIG. 1) which uses information from the height sensor to control the holder mover assembly 756.

For example, the holder mover assembly 756 can include one or more rotary motors, voice coil motors, linear motors, electromagnetic actuators, and/or other types of force actuators. In one embodiment, the holder mover assembly 756 moves and positions the device holder 752 and the wafer 730 along the Z axis, about the X axis and about the Y axis under the control of the control system 24 (illustrated in FIG. 1).

Figure 8A:
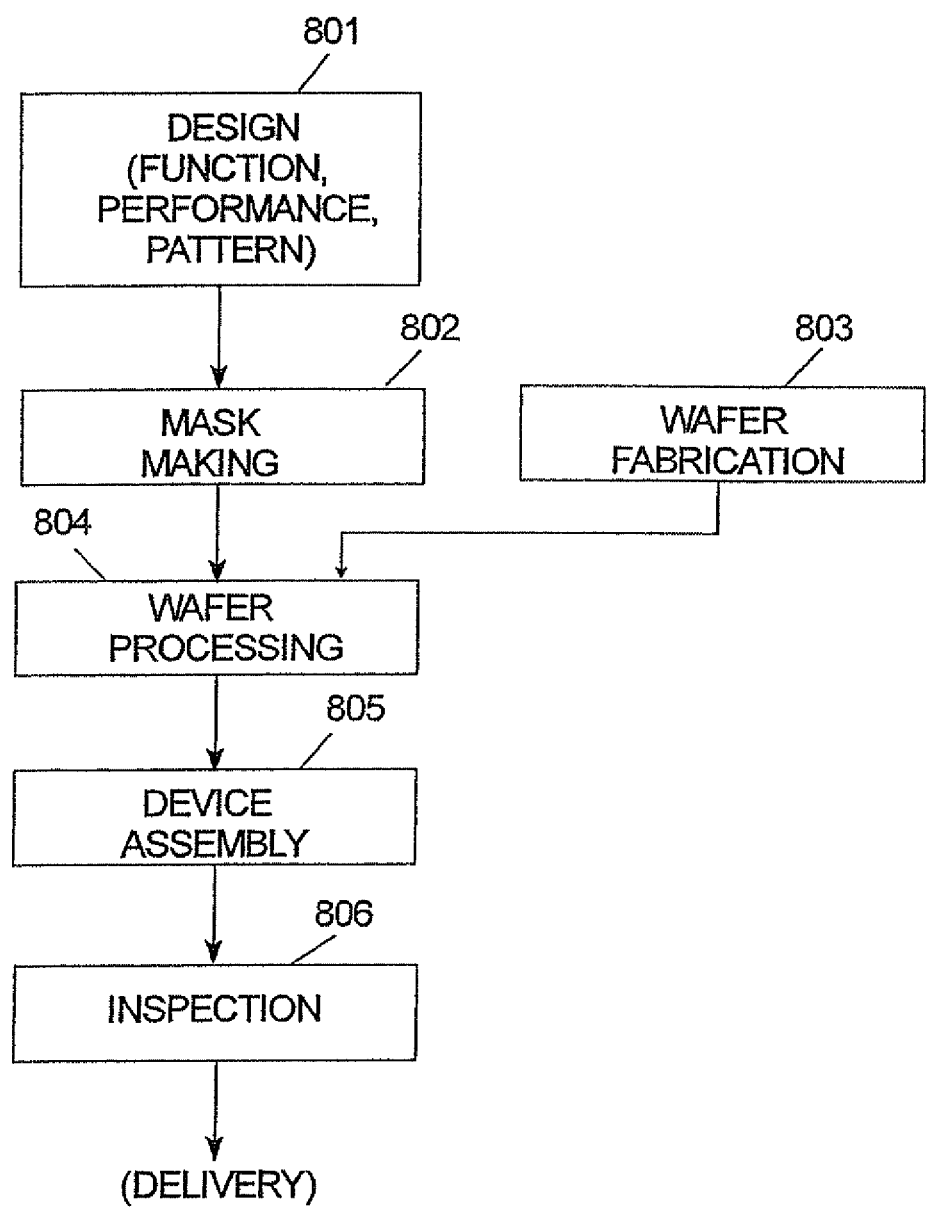
FIG. 8A is a flow chart that outlines a process for manufacturing a device in accordance with the invention.

Semiconductor devices can be fabricated using the above described systems, by the process shown generally in FIG. 8A. In step 801 the device's function and performance characteristics are designed. Next, in step 802, a mask (reticle) having a pattern is designed according to the previous designing step, and in a parallel step 803 a wafer is made from a silicon material. The mask pattern designed in step 802 is exposed onto the wafer from step 803 in step 804 by a photolithography system described hereinabove in accordance with the invention. In step 805 the semiconductor device is assembled (including the dicing process, bonding process and packaging process). Finally, the device is then inspected in step 806.

Figure 8B:
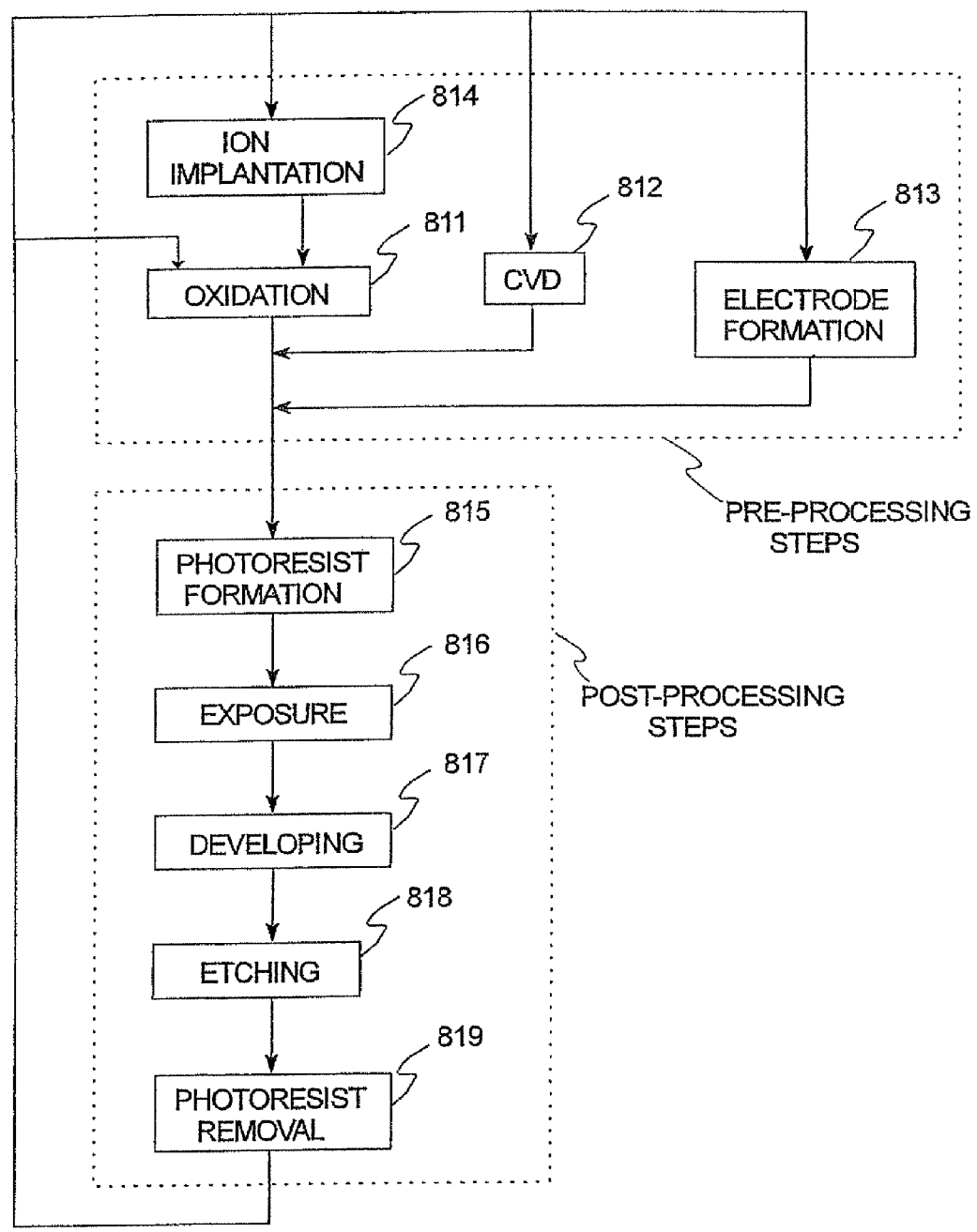
FIG. 8B is a flow chart that outlines device processing in more detail.

FIG. 8B illustrates a detailed flowchart example of the above-mentioned step 804 in the case of fabricating semiconductor devices. In FIG. 8B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

While the exposure apparatus 10 as shown and described herein is fully capable of providing the advantages described herein, it is merely illustrative of embodiments of the invention. No limitations are intended to the details of construction or design herein shown.

What is claimed is:

1. A liquid immersion lithography apparatus in which a wafer is exposed through a liquid in a space immediately under a lens, the apparatus comprising:
   a containment member provided such that the containment member surrounds the space immediately under the lens; and
   a seal member provided between the lens and the containment member,
   wherein:
   the containment member has a first fluid inlet,
   the first fluid inlet removes fluid from a first gap between the containment member and the wafer during the exposure,
   the containment member has a lower surface,
   during the exposure, the wafer faces the lower surface of the containment member and the first fluid inlet removes the fluid between the lower surface of the containment member and the wafer,
   the lower surface of the containment member has an inner edge from which an inner side surface extends upwardly such that the inner side surface surrounds the space immediately under the lens,
   the lower surface extends radially outwardly from the inner edge,
   the first fluid inlet is provided radially outwardly away from the inner edge,
   the inner edge of the lower surface defines an opening below the lens,
   the lens is arranged such that the liquid in the space immediately under the lens contacts the lens, and the lens is spaced from a portion of the containment member having the opening such that a second gap exists between the portion of the containment member having the opening and a side surface of the lens, the side surface of the lens extending in a direction away from the wafer, and
   the space immediately under the lens is in continuous fluid communication with the first fluid inlet via the opening.

2. The apparatus according to claim 1, wherein a vacuum is applied to the first fluid inlet.

3. The apparatus according to claim 1, wherein the containment member defines a part of a boundary of the space immediately under the lens.

4. The apparatus according to claim 1, wherein the containment member comes into contact with the liquid in the space immediately under the lens.

5. The apparatus according to claim 1, wherein the first fluid inlet is located in the lower surface of the containment member.

6. The apparatus according to claim 5, wherein the first fluid inlet includes a groove formed in the lower surface of the containment member.

7. The apparatus according to claim 1, wherein the containment member is provided such that during the exposure, a distance between the lower surface and the wafer is smaller than a distance between the lens and the wafer.

8. The apparatus according to claim 1, wherein during the exposure, the inner side surface comes into contact with the liquid in the space immediately under the lens.

9. The apparatus according to claim 1, wherein the seal member is disposed above the lower surface.

10. The apparatus according to claim 9, wherein the seal member seals the space immediately under the lens.

11. The apparatus according to claim 1, wherein a fluid bearing is formed under the containment member.

12. The apparatus according to claim 11, wherein the liquid flowing under the containment member creates the fluid bearing.

13. The apparatus according to claim 11, wherein the fluid bearing includes a gas bearing.

14. The apparatus according to claim 13, wherein the gas bearing supports the weight of the containment member.

15. The apparatus according to claim 1, wherein the containment member has a gas supply outlet that supplies a gas between the containment member and the wafer during the exposure.

16. The apparatus according to claim 15, wherein the gas supply outlet is located farther away from the space immediately under the lens than is the first fluid inlet.

17. The apparatus according to claim 15, wherein a gas supplied from the gas supply outlet helps to contain the liquid.

18. The apparatus according to claim 15, wherein the containment member has a second fluid inlet that is located farther away from the space immediately under the lens than is the gas supply outlet and that removes fluid between the containment member and the wafer during the exposure.

19. The apparatus according to claim 18, wherein the fluid includes the liquid.

20. The apparatus according to claim 19, wherein the second fluid inlet removes the liquid not removed by the first fluid inlet.

21. The apparatus according to claim 19, wherein the second fluid inlet removes the liquid which leaks beyond the first fluid inlet.

22. The apparatus according to claim 1, wherein the containment member has a second fluid inlet that is located farther away from the space immediately under the lens than is the first fluid inlet and that removes fluid between the containment member and the wafer during the exposure.

23. The apparatus according to claim 1, wherein the fluid includes the liquid.

24. The apparatus according to claim 1, wherein the wafer is placed under the lens, and the space is between the wafer and a lower surface of the lens, the space extending continuously from the lower surface of the lens to the wafer via the opening.

25. The apparatus according to claim 1, wherein the seal member is attached to the containment member.

26. The apparatus according to claim 1, wherein the seal member is attached to the lens.

27. A liquid immersion lithography method comprising:
containing a liquid in a space immediately under a lens using a containment member and a seal member disposed between the lens and the containment member;
exposing a wafer through the liquid contained in the space immediately under the lens; and
removing fluid via a first fluid inlet of the containment member from a first gap between the containment member and the wafer
wherein
the containment member has a lower surface,
during the exposure, the wafer faces the lower surface of the containment member and the first fluid inlet removes the fluid between the lower surface of the containment member and the wafer,
the lower surface of the containment member has an inner edge from which an inner side surface extends upwardly such that the inner side surface surrounds the space immediately under the lens,
the lower surface extends radially outwardly from the inner edge,
the first fluid inlet is provided radially outwardly away from the inner edge,
the inner edge of the lower surface defines an opening below the lens,
the lens is arranged such that the liquid in the space immediately under the lens contacts the lens, and the lens is spaced from a portion of the containment member having the opening such that a second gap exists between the portion of the containment member having the opening and a side surface of the lens, the side surface of the lens extending in a direction away from the wafer, and
the space immediately under the lens is in continuous fluid communication with the first fluid inlet via the opening.

28. The method according to claim 27, wherein vacuum is applied to the first fluid inlet.

29. The method according to claim 27, wherein a fluid bearing is formed under the containment member.

30. The method according to claim 29, wherein the liquid flowing under the containment member creates the fluid bearing.

31. The method according to claim 29, wherein the fluid bearing includes a gas bearing.

32. The method according to claim 27, further comprising supplying a gas via a gas supply outlet of the containment member between the containment member and the wafer.

33. The method according to claim 32, wherein the gas supply outlet is located farther away from the space immediately under the lens than is the first fluid inlet.

34. The method according to claim 32, wherein the gas supplied via the gas supply outlet helps to contain the liquid.

35. The method according to claim 32, further comprising removing fluid via a second fluid inlet of the containment member from between the containment member and the wafer,
wherein the second fluid inlet is located farther away from the space immediately under the lens than is the gas supply outlet.

36. The method according to claim 35, wherein the fluid includes the liquid.

37. The method according to claim 36, wherein the liquid not removed by the first fluid inlet is removed by the second fluid inlet.

38. The method according to claim 36, wherein the liquid which leaks beyond the first fluid inlet is removed by the second fluid inlet.

39. The method according to claim 27, further comprising removing fluid via a second fluid inlet of the containment member from between the containment member and the wafer,
wherein the second fluid inlet is located farther away from the space immediately under the lens than is the first fluid outlet.

40. The method according to claim 27, wherein the fluid includes the liquid.

41. The method according to claim 27, wherein the seal member is attached to the containment member.

42. The method according to claim 27, wherein the seal member is attached to the lens.

43. The method according to claim 27, wherein the wafer is placed under the lens, and the space is between the wafer and a lower surface of the lens, the space extending continuously from the lower surface of the lens to the wafer via the opening.

* * * * *